(12) United States Patent
Shirakawa et al.

(10) Patent No.: US 8,080,362 B2
(45) Date of Patent: Dec. 20, 2011

(54) POSITIVE RESIST COMPOSITION

(75) Inventors: Koji Shirakawa, Shizuoka (JP); Toru Fujimori, Shizuoka (JP); Shoichiro Yasunami, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 303 days.

(21) Appl. No.: 11/926,479

(22) Filed: Oct. 29, 2007

(65) Prior Publication Data

US 2008/0096130 A1    Apr. 24, 2008

Related U.S. Application Data

(63) Continuation of application No. 10/812,074, filed on Mar. 30, 2004, now Pat. No. 7,361,446.

(30) Foreign Application Priority Data

Mar. 31, 2003   (JP) .............................. P.2003-094331

(51) Int. Cl.
  *G03C 1/00*  (2006.01)
  *G03F 7/00*  (2006.01)
  *H01L 21/00*  (2006.01)
(52) U.S. Cl. ..................... 430/270.1; 430/322
(58) Field of Classification Search ............... 430/281.1, 430/270.1, 322
  See application file for complete search history.

(56) References Cited

U.S. PATENT DOCUMENTS

| | | | |
|---|---|---|---|
| 6,489,080 B2 | 12/2002 | Uenishi et al. | |
| 6,537,718 B2 | 3/2003 | Nishiyama et al. | |
| 6,605,409 B2 | 8/2003 | Kodama et al. | |
| 6,630,280 B1 | 10/2003 | Fujimori et al. | |
| 6,656,660 B1 | 12/2003 | Urano et al. | |
| 6,756,179 B2 | 6/2004 | Fujimori et al. | |
| 6,806,023 B2 | 10/2004 | Kanna et al. | |
| 2001/0008739 A1 | 7/2001 | Nishiyama et al. | |
| 2001/0055726 A1 | 12/2001 | Kanna et al. | |
| 2002/0015916 A1* | 2/2002 | Uenishi et al. | 430/281.1 |
| 2002/0058200 A1* | 5/2002 | Fujimori et al. | 430/270.1 |
| 2002/0155383 A1* | 10/2002 | Fujimori et al. | 430/282.1 |
| 2003/0134225 A1* | 7/2003 | Fujimori et al. | 430/270.1 |

FOREIGN PATENT DOCUMENTS

| | | |
|---|---|---|
| JP | 2-19847 A | 1/1990 |
| JP | 4-219757 A | 8/1992 |
| JP | 9-319092 A | 12/1997 |
| JP | 10-221854 A | 8/1998 |
| JP | 11-305443 A | 11/1999 |
| JP | 2000-338677 A | 10/2000 |
| JP | 2002-49156 A | 2/2002 |
| JP | 2002-323768 A | 11/2002 |

OTHER PUBLICATIONS

Fujimori et al., "Structural Design of a New Class of Acetal Polymer for DUV resists.", Proceedings of SPIE, vol. 3999, (Published in 2000), pp. 579-590.*

Manako et al., "Resolution-Limit Study of Chain-Structure Negative Resist by Electron Beam Lithography", Japanese Journal of Applied Physics, vol. 36 (1997), pp. L 724-L 726, Part 2, No. 6A, Jun. 1, 1997.*

* cited by examiner

*Primary Examiner* — Cynthia H Kelly
*Assistant Examiner* — Connie P Johnson
(74) *Attorney, Agent, or Firm* — Sughrue Mion, PLLC

(57) ABSTRACT

A positive resist composition comprising (a) a resin that is decomposed by the action of an acid to increase solubility in an alkali developing solution, contains a structural unit having a group represented by formula (X) defined in the specification, has a weight average molecular weight of not more than 5,000, and contains an acid decomposable group in an amount of not more than 40% based on the sum total of a number of the acid decomposable group and a number of an alkali-soluble group not protected with the acid decomposable group, and (b) a compound that generates an acid upon irradiation of an actinic ray or radiation.

10 Claims, No Drawings

POSITIVE RESIST COMPOSITION

This is a continuation of application Ser. No. 10/812,074 filed Mar. 30, 2004 now U.S. Pat. No. 7,361,446. The entire disclosure of the prior application, application Ser. No. 10/812,074, is hereby incorporated by reference.

FIELD OF THE INVENTION

The present invention relates to a positive resist composition suitably used for super-microlithographic processes, for example, the production of VLSI and high-capacity microchips, and other photofabrication processes. More specifically, the invention relates to a positive resist composition capable of forming high precision patterns using an electron beam, an X ray or an EUV beam and particularly to a positive resist composition, which can be suitably used for fine fabrication of semiconductor devices using a high energy ray, for example, an electron beam.

BACKGROUND OF THE INVENTION

In processes for the production of semiconductor devices, for example, IC or LSI, fine fabrication is conducted by means of lithography using a photoresist composition. In recent years, as the degree of integration in integrated circuits increases, it has been requested to form an ultra fine pattern in the submicron region or the quarter micron region. With such a trend, an exposure wavelength tends to become shorter such as from g-line to i-line and further to a KrF excimer laser beam. Moreover, the development of lithography using an electron beam, an X ray or an EUV beam also proceeds at present in addition to the use of an excimer laser beam.

In particular, the electron beam lithography is regarded as the pattern formation technique of next generation or after the next generation, and the development of a positive resist having high sensitivity and high resolution has been desired. Particularly, the increase in sensitivity is a very important problem in order to shorten a wafer processing time. However, when high sensitivity is tried to pursue with respect to a positive resist for an electron beam, a problem arises in that preservation stability after exposure in vacuo (hereinafter referred to as in vacuo PED) deteriorates. Thus, development of resist that satisfies both requirements has been strongly required. The same problems are also present in lithography using an X ray or an EUV beam and thus it is desired to solve these problems.

As a resist suitable for lithographic process using an electron beam, an X ray or an EUV beam, a chemical amplification resist utilizing mainly an acid catalytic reaction is used in view of the increase in sensitivity. With respect to a positive resist, a chemical amplification composition containing as the main components, a polymer having a property of being insoluble or hardly soluble in an aqueous alkali solution and becoming soluble in the aqueous alkali solution upon the action of an acid (hereinafter also referred to as an acid decomposable resin) and an acid generating agent is effectively used.

With respect to a positive resist for an electron beam or an X ray, resist techniques for a KrF excimer laser have been mainly diverted and investigated. For instance, a resist composition containing a polymer wherein phenolic hydroxy groups of poly (p-hydroxystyrene) are fully or partially protected with tetrahydropyranyl groups is described in Patent Document 1 (JP-A-2-19847 (the term "JP-A" as used herein means an "unexamined published Japanese patent application")).

Also, a resist composition containing a polymer wherein from 20 to 70% of phenolic hydroxy groups of poly (p-hydroxystyrene) are substituted with acetal groups is described in Patent Document 2 (JP-A-4-219757).

Further, it is described in Patent Document 3 (JP-A-9-319092) that a resin having an acetal group introduced is effective for reduction of standing wave.

Moreover, resins containing substituted acetal units are described in Patent Document 4 (JP-A-10-221854), Patent Document 5 (JP-A-11-305443) and Patent Document 6 (JP-A-2002-323768).

However, under the present situation, the techniques described above cannot simultaneously satisfy the high sensitivity, high resolution, good pattern profile and good in vacuo PED property. Particularly, the in vacuo PED property is a very important property in case of exposing in vacuo with an electron beam or an X ray. When the in vacuo PED property is poor, performances are remarkably changed between the initial stage of drawing and the final stage of drawing in case of drawing with an electron beam or an X ray. As a result, uniformity of line width in the drawing pattern is significantly injured and severe reduction of yield occurs.

Thus, according to the combination of conventionally known techniques, it is difficult to satisfy all of the high sensitivity, high resolution, good pattern profile and good in vacuo PED property under irradiation of an electron beam or an X ray. Therefore, it has been strongly desired to satisfy all of these properties.

Patent Document 1: JP-A-2-19847
Patent Document 2: JP-A-4-219757
Patent Document 3: JP-A-9-319092
Patent Document 4: JP-A-10-221854
Patent Document 5: JP-A-11-305443
Patent Document 6: JP-A-2002-323768

SUMMARY OF THE INVENTION

An object of the invention is to solve the problems on performance improving techniques in ultra fine fabrication of semiconductor device using a high energy beam, particularly, an electron beam, an X ray or an EUV beam.

Specifically, an object of the invention is to provide a positive resist composition that simultaneously satisfies the high sensitivity, high resolution, good pattern profile and good in vacuo PED property.

Other objects of the invention will become apparent from the following description.

As a result of the extensive investigations in light of such a situation, it has been found that the above-described objects of the invention can be achieved by using a positive resist composition including a compound containing an acid decomposable group having a specific structure.

Specifically, the positive resist composition according to the invention has the following constructions.

(1) A positive resist composition comprising (a) a resin that is decomposed by the action of an acid to increase solubility in an alkali developing solution, contains a structural unit having a group represented by formula (X) shown below, has a weight average molecular weight of not more than 5,000, and contains an acid decomposable group in an amount of not more than 40% based on the sum total of a number of the acid decomposable group and a number of an alkali-soluble group not protected with the acid decomposable group, and (b) a compound that generates an acid upon irradiation of an actinic ray or radiation:

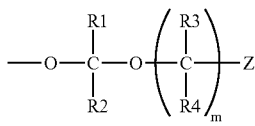 (X)

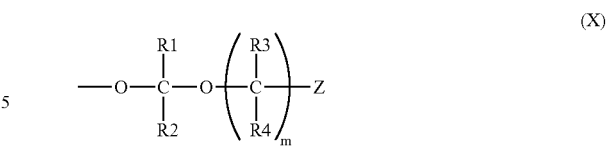 (X)

in formula (X), R1 and R2, which may be the same or different, each represent a hydrogen atom or an alkyl group having from 1 to 4 carbon atoms, which may have a substituent; R3 and R4, which may be the same or different, each represent a hydrogen atom or an alkyl group; Z represents a phenyl group, which may have a substituent or an alicyclic group, which may have a substituent; and m represents an integer of from 1 to 20.

(2) The positive resist composition as described in item (1) above, which further comprises a nitrogen-containing basic compound.

(3) The positive resist composition as described in item (1) or (2) above, which further comprises a surfactant.

(4) The positive resist composition as described in any one of items (1) to (3) above, wherein the compound that generates an acid upon irradiation of an actinic ray or radiation comprises a compound that generates a sulfonic acid upon irradiation of an actinic ray or radiation.

(5) The positive resist composition as described in any one of items (1) to (3) above, wherein the compound that generates an acid upon irradiation of an actinic ray or radiation comprises two or more compounds that generate an acid upon irradiation of an actinic ray or radiation and at least one of the compounds that generate an acid upon irradiation of an actinic ray or radiation is a compound that generates a carboxylic acid upon irradiation of an actinic ray or radiation.

(6) The positive resist composition as described in any one of items (1) to (5) above, which further comprises a solvent.

(7) The positive resist composition as described in item (6) above, wherein the solvent comprises propylene glycol monomethyl ether acetate.

8. The positive resist composition as described in item (7) above, wherein the solvent further comprises propylene glycol monomethyl ether.

9. The positive resist composition as described in any one of items (1) to (8) above, which is irradiated with an actinic ray or radiation selected from an electron beam, an X-ray and an EUV-beam.

10. A pattern formation process comprising preparing a resist film with the positive resist composition as described in any one of items (1) to (8) above, irradiating the resist film with an actinic ray or radiation and developing the irradiated resist film with a developing solution.

DETAILED DESCRIPTION OF THE INVENTION

The invention will be described in greater detail below.

[1] Component (A): Resin that is Decomposed by the Action Of an Acid to Increase Solubility in an Alkali Developing Solution Component (A) (Resin (A)) according to the invention is a resin that is decomposed by the action of an acid to increase solubility in an alkali developing solution and contains a structural unit having an acid decomposable group represented by formula (X) shown below.

In formula (X), R1 and R2, which may be the same or different, each represent a hydrogen atom or an alkyl group having from 1 to 4 carbon atoms. R3 and R4, which may be the same or different, each represent a hydrogen atom or an alkyl group. Z represents a phenyl group or an alicyclic group. m represents an integer of from 1 to 20.

The alkyl group represented by R1 or R2 in formula (X) is an alkyl group having from 1 to 4 carbon atoms and include, for example, methyl, ethyl, n-propyl, isopropyl, n-butyl, isobutyl, sec-butyl and tert-butyl groups.

R3 and R4 in formula (X), which may be the same or different, each represent a hydrogen atom or an alkyl group, which may have a substituent. The alkyl group may be any of straight chain, branched and cyclic alkyl groups.

The straight chain alkyl group has preferably from 1 to 30 carbon atoms, more preferably from 1 to 20 carbon atoms, and includes, for example, methyl, ethyl, n-propyl, n-butyl, n-pentyl, n-hexyl, n-heptyl, n-octyl, n-nonyl and n-decyl groups.

The branched alkyl group has preferably from 3 to 30 carbon atoms, more preferably from 3 to 20 carbon atoms, and includes, for example, isopropyl, isobutyl, tert-butyl, isopentyl, tert-pentyl, isohexyl, tert-hexyl, isoheptyl, tert-heptyl, isooctyl, tert-octyl, isononyl and tert-decyl groups.

The cyclic alkyl group has preferably from 3 to 30 carbon atoms, more preferably from 3 to 20 carbon atoms, and includes, for example, cyclopropyl, cyclobutyl, cyclopentyl, cyclohexyl, cycloheptyl, cyclooctyl, cyclononyl and cyclodecyl groups.

It is preferred that at least one of R1 and R2 is a straight chain or branched alkyl group having from 1 to 4 carbon atoms.

Z in formula (X) represents a phenyl group or an alicyclic group. The phenyl group represented by Z may have a substituent and includes a group represented by the following formula:

wherein R5 represents an alkyl group, which may have a substituent, an aryl group, which may have a substituent or an aralkyl group, which may have a substituent; and n represents an integer of from 0 to 5.

The alkyl group represented by R5 may be any of straight chain, branched and cyclic alkyl groups.

The straight chain or branched alkyl group represented by R5 has preferably from 1 to 30 carbon atoms, more preferably from 1 to 20 carbon atoms, and includes, for example, methyl, ethyl, n-propyl, isopropyl, n-butyl, isobutyl, tert-butyl, n-pentyl, isopentyl, tert-pentyl, n-hexyl, isohexyl, tert-hexyl, n-heptyl, isoheptyl, tert-heptyl, n-octyl, isooctyl, tert-octyl, n-nonyl, isononyl, tert-nonyl, n-decyl, isodecyl, tert-decyl, n-undecyl, isoundecyl, n-dodecyl, isododecyl, n-tridecyl, isotridecyl, n-tetradecyl, isotetradecyl, n-pentadecyl, isopentadecyl, n-hexadecyl, isohexadecyl, n-heptadecyl, isoheptadecyl, n-octadecyl, isooctsdecyl, n-nonadecyl and isononadecyl groups.

The cyclic alkyl group represented by R5 has preferably from 3 to 30 carbon atoms, more preferably from 3 to 20 carbon atoms. The cyclic alkyl group may be a cycloalkyl group including a ring containing up to 20 carbon atoms or a cycloalkyl group having a substituent. The cyclic alkyl group includes, for example, cyclopropyl, cyclobutyl, cyclopentyl, cyclohexyl, cycloheptyl, cyclooctyl, cyclononyl, cyclodecyl, cycloundecyl, cyclododecyl, cyclotridecyl, cyclotetradecyl, cyclopentadecyl, cyclohexadecyl, cycloheptadecyl, cyclooctadecyl, cyclononadecyl, 4-cyclohexylcyclohexyl, 4-n-hexylcyclohexyl, pentylcyclohexyl, hexyloxycyclohexyl and pentyloxycyclohexyl groups. Substituted cycloalkyl groups other than those described above may be used as long as they have carbon atoms within the above described range.

The aryl group represented by R5 has preferably from 6 to 30 carbon atoms, more preferably from 6 to 20 carbon atoms, and includes, for example, phenyl, 4-methylphenyl, 3-methylphenyl, 2-methylphenyl, 4-ethylphenyl, 3-ethylphenyl, 2-ethylphenyl, 4-n-propylphenyl, 3-n-propylphenyl, 2-n-propylphenyl, 4-isopropylphenyl, 3-isopropylphenyl, 2-isopropylphenyl, 4-cyclopropylphenyl, 3-cyclopropylphenyl, 2-cyclopropylphenyl, 4-n-butylphenyl, 3-n-butylphenyl, 2-n-butylphenyl, 4-isobutylphenyl, 3-isobutylphenyl, 2-isobutylphenyl, 4-tert-butylphenyl, 3-tert-butylphenyl, 2-tert-butylphenyl, 4-cyclobutylphenyl, 3-cyclobutylphenyl, 2-cyclobutylphenyl, 4-cyclopentylphenyl, 4-cyclohexylphenyl, 4-cyclohepylphenyl, 4-cyclooctylphenyl, 2-cyclopentylphenyl, 2-cyclohexylphenyl, 2-cyclohepylphenyl, 2-cyclooctylphenyl, 3-cyclopentylphenyl, 3-cyclohexylphenyl, 3-cyclohepylphenyl, 3-cyclooctylphenyl, 4-cyclopentyloxyphenyl, 4-cyclohexyloxyphenyl, 4-cyclohepyloxyphenyl, 4-cyclooctyloxyphenyl, 2-cyclopentyloxyphenyl, 2-cyclohexyloxyphenyl, 2-cyclohepyloxyphenyl, 2-cyclooctyloxyphenyl, 3-cyclopentyloxyphenyl, 3-cyclohexyloxyphenyl, 3-cyclohepyloxyphenyl, 3-cyclooctyloxyphenyl, 4-n-pentylphenyl, 4-n-hexylphenyl, 4-n-heptylphenyl, 4-n-octylphenyl, 2-n-pentylphenyl, 2-n-hexylphenyl, 2-n-heptylphenyl, 2-n-octylphenyl, 3-n-pentylphenyl, 3-n-hexylphenyl, 3-n-heptylphenyl, 3-n-octylphenyl, 2,6-diisopropylphenyl, 2,3-diisopropylphenyl, 2,4-diisopropylphenyl, 3,4-diisopropylphenyl, 2,6-di-tert-butylphenyl, 2,3-di-tert-butylphenyl, 2,4-di-tert-butylphenyl, 3,4-di-tert-butylphenyl, 2,6-di-n-butylphenyl, 2,3-di-n-butylphenyl, 2,4-di-n-butylphenyl, 3,4-di-n-butylphenyl, 2,6-diisobutylphenyl, 2,3-diisobutylphenyl, 2,4-diisobutylphenyl, 3,4-diisobutylphenyl, 2,6-di-tert-amylphenyl, 2,3-di-tert-amylphenyl, 2,4-di-tert-amylphenyl, 3,4-di-tert-amylphenyl, 2,6-diisoamylphenyl, 2,3-diisoamylphenyl, 2,4-diisoamylphenyl, 3,4-diisoamylphenyl, 2,6-di-n-pentylphenyl, 2,3-di-n-pentylphenyl, 2,4-di-n-pentylphenyl, 3,4-di-n-pentylphenyl, 4-adamantylphenyl, 2-adamantylphenyl, 4-isobornylphenyl, 3-isobornylphenyl, 2-isobornylphenyl, 4-cyclopentyloxyphenyl, 4-cyclohexyloxyphenyl, 4-cycloheptyloxyphenyl, 4-cyclooctyloxyphenyl, 2-cyclopentyloxyphenyl, 2-cyclohexyloxyphenyl, 2-cycloheptyloxyphenyl, 2-cyclooctyloxyphenyl, 3-cyclopentyloxyphenyl, 3-cyclohexyloxyphenyl, 3-cycloheptyloxyphenyl, 3-cyclooctyloxyphenyl, 4-n-pentyloxyphenyl, 4-n-hexyloxyphenyl, 4-n-heptyloxyphenyl, 4-n-octyloxyphenyl, 2-n-pentyloxyphenyl, 2-n-hexyloxyphenyl, 2-n-heptyloxyphenyl, 2-n-octyloxyphenyl, 3-n-pentyloxyphenyl, 3-n-hexyloxyphenyl, 3-n-heptyloxyphenyl, 3-n-octyloxyphenyl, 2,6-diisopropyloxyphenyl, 2,3-diisopropyloxyphenyl, 2,4-diisopropyloxyphenyl, 3,4-diisopropyloxyphenyl, 2,6-di-tert-butyloxyphenyl, 2,3-di-tert-butyloxyphenyl, 2,4-di-tert-butyloxyphenyl, 3,4-di-tert-butyloxyphenyl, 2,6-di-n-butyloxyphenyl, 2,3-di-n-butyloxyphenyl, 2,4-di-n-butyloxyphenyl, 3,4-di-n-butyloxyphenyl, 2,6-diisobutyloxyphenyl, 2,3-diisobutyloxyphenyl, 2,4-diisobutyloxyphenyl, 3,4-diisobutyloxyphenyl, 2,6-di-tert-amyloxyphenyl, 2,3-di-tert-amyloxyphenyl, 2,4-di-tert-amyloxyphenyl, 3,4-di-tert-amyloxyphenyl, 2,6-diisoamyloxyphenyl, 2,3-diisoamyloxyphenyl, 2,4-diisoamyloxyphenyl, 3,4-diisoamyloxyphenyl, 2,6-di-n-pentyloxyphenyl, 2,3-di-n-pentyloxyphenyl, 2,4-di-n-pentyloxyphenyl, 3,4-di-n-pentyloxyphenyl, 4-adamantyloxyphenyl, 3-adamantyloxyphenyl, 2-adamantyloxyphenyl, 4-isobornyloxyphenyl, 3-isobornyloxyphenyl and 2-isobornyloxyphenyl groups. These examples of the aryl group may further have substituents other than those described above as long as they have carbon atoms within the above described range.

The aralkyl group represented by R5 has preferably from 7 to 30 carbon atoms, more preferably from 7 to 20 carbon atoms, and includes, for example, phenylethyl, 4-methylphenylethyl, 3-methylphenylethyl, 2-methylphenylethyl, 4-ethylphenylethyl, 3-ethylphenylethyl, 2-ethylphenylethyl, 4-n-propylphenylethyl, 3-n-propylphenylethyl, 2-n-propylphenylethyl, 4-isopropylphenylethyl, 3-isopropylphenylethyl, 2-isopropylphenylethyl, 4-cyclopropylphenylethyl, 3-cyclopropylphenylethyl, 2-cyclopropylphenylethyl, 4-n-butylphenylethyl, 3-n-butylphenylethyl, 2-n-butylphenylethyl, 4-isobutylphenylethyl, 3-isobutylphenylethyl, 2-isobutylphenylethyl, 4-tert-butylphenylethyl, 3-tert-butylphenylethyl, 2-tert-butylphenylethyl, 4-cyclobutylphenylethyl, 3-cyclobutylphenylethyl, 2-cyclobutylphenylethyl, 4-cyclopentylphenylethyl, 4-cyclohexylphenylethyl, 4-cyclohepylphenylethyl, 4-cyclooctylphenylethyl, 2-cyclopentylphenylethyl, 2-cyclohexylphenylethyl, 2-cyclohepylphenylethyl, 2-cyclooctylphenylethyl, 3-cyclopentylphenylethyl, 3-cyclohexylphenylethyl, 3-cyclohepylphenylethyl, 3-cyclooctylphenylethyl, 4-cyclopentyloxyphenylethyl, 4-cyclohexyloxyphenylethyl, 4-cyclohepyloxyphenylethyl, 4-cyclooctyloxyphenylethyl, 2-cyclopentyloxyphenyl, 2-cyclohexyloxyphenyl, 2-cyclohepyloxyphenylethyl, 2-cyclooctyloxyphenylethyl, 3-cyclopentyloxyphenylethyl, 3-cyclohexyloxyphenylethyl, 3-cyclohepyloxyphenylethyl, 3-cyclooctyloxyphenylethyl, 4-n-pentylphenylethyl, 4-n-hexylphenylethyl, 4-n-heptylphenylethyl, 4-n-octylphenylethyl, 2-n-pentylphenylethyl, 2-n-hexylphenylethyl, 2-n-heptylphenylethyl, 2-n-octylphenylethyl, 3-n-pentylphenylethyl, 3-n-hexylphenylethyl, 3-n-heptylphenylethyl, 3-n-octylphenylethyl, 2,6-diisopropylphenylethyl, 2,3-diisopropylphenylethyl, 2,4-diisopropylphenylethyl, 3,4-diisopropylphenylethyl, 2,6-di-tert-butylphenylethyl, 2,3-di-tert-butylphenylethyl, 2,4-di-tert-butylphenylethyl, 3,4-di-tert-butylphenylethyl, 2,6-di-n-butylphenylethyl, 2,3-di-n-butylphenylethyl, 2,4-di-n-butylphenylethyl, 3,4-di-n-butylphenylethyl, 2,6-diisobutylphenylethyl, 2,3-diisobutylphenylethyl, 2,4-diisobutylphenylethyl, 3,4-diisobutylphenylethyl, 2,6-di-tert-amylphenylethyl, 2,3-di-tert-amylphenylethyl, 2,4-di-tert-amylphenylethyl, 3,4-di-tert-amylphenylethyl, 2,6-diisoamylphenylethyl, 2,3-diisoamylphenylethyl, 2,4-diisoamylphenylethyl, 3,4-diisoamylphenylethyl, 2,6-di-n-pentylphenylethyl, 2,3-di-n-pentylphenylethyl, 2,4-di-n-pentylphenylethyl, 3,4-di-n-pentylphenylethyl, 4-adamantylphenylethyl, 3-adamantylphenylethyl, 2-adamantylphenylethyl, 4-isobornylphenylethyl, 3-isobornylphenylethyl, 2-isobornylphenylethyl, 4-cyclopentyloxyphenylethyl, 4-cyclohexyloxyphenylethyl, 4-cycloheptyloxyphenylethyl, 4-cyclooctyloxyphenylethyl, 2-cyclopentyloxyphenylethyl, 2-cyclohexyloxyphenylethyl, 2-cycloheptyloxyphenylethyl, 2-cyclooctyloxyphenylethyl, 3-cyclopentyloxyphenylethyl, 3-cyclohexyloxyphenylethyl, 3-cycloheptyloxyphenylethyl, 3-cyclooctyloxyphenylethyl, 4-n-pentyloxyphenylethyl, 4-n-hexyloxyphenylethyl, 4-n-heptyloxyphenylethyl, 4-n-octyloxyphenylethyl, 2-n-pentyloxyphenylethyl, 2-n-hexyloxyphenylethyl, 2-n-heptyloxyphenylethyl, 2-n-octyloxyphenylethyl, 3-n-pentyloxyphenylethyl, 3-n-hexyloxyphenylethyl, 3-n-heptyloxyphenylethyl, 3-n-octyloxyphenylethyl, 2,6-diisopropyloxyphenylethyl, 2,3-diisopropyloxyphenylethyl, 2,4-diisopropyloxyphenylethyl, 3,4-diisopropyloxyphenylethyl, 2,6-di-tert-butyloxyphenylethyl, 2,3-di-tert-butyloxyphenylethyl, 2,4-di-tert-butyloxyphenylethyl, 3,4-di-tert-butyloxyphenylethyl, 2,6-di-n-butyloxyphenylethyl, 2,3-di-n-butyloxyphenylethyl, 2,4-di-n-butyloxyphenylethyl, 3,4-di-n-butyloxyphenylethyl, 2,6-diisobutyloxyphenylethyl, 2,3-diisobutyloxyphenylethyl, 2,4-diisobutyloxyphenylethyl, 3,4-diisobutyloxyphenylethyl, 2,6-di-tert-amyloxyphenylethyl, 2,3-di-tert-amyloxyphenylethyl, 2,4-di-tert-amyloxyphenylethyl, 3,4-di-tert-amyloxyphenylethyl, 2,6-diisoamyloxyphenylethyl, 2,3-diisoamyloxyphenylethyl, 2,4-diisoamyloxyphenylethyl, 3,4-diisoamyloxyphenylethyl, 2,6-di-n-pentyloxyphenylethyl, 2,3-di-n-pentyloxyphenylethyl, 2,4-di-n-pentyloxyphenylethyl, 3,4-di-n-pentyloxyphenylethyl, 4-adamantyloxyphenylethyl, 3-adamantyloxyphenylethyl, 2-adamantyloxyphenylethyl, 4-isobornyloxyphenylethyl, 3-isobornyloxyphenylethyl and 2-isobornyloxyphenylethyl groups, and groups wherein the ethyl groups in the above specific examples of the aralkyl group are replaced by other alkyl groups, for example, methyl groups, propyl groups or butyl groups.

Examples of the further substituent for the above described groups include a hydroxy group, a halogen atom (e.g., fluorine, chlorine, bromine or iodine), a nitro group, a cyano group, the above described alkyl group, an alkoxy group (e.g., methoxy, ethoxy, hydroxyethoxy, propoxy, hydroxypropoxy, n-butoxy, isobutoxy, sec-butoxy or tert-butoxy), an alkoxycarbonyl group (e.g., methoxycarbonyl or ethoxycarbonyl), an aralkyl group (e.g., benzyl phenethyl or cumyl), an aralkyloxy group, an acyl group (e.g., formyl, acetyl, butyryl, benzoyl, cinnamoyl or valeryl), an acyloxy group (e.g., butyryloxy), the above described alkenyl group, an alkenyloxy group (e.g., vinyloxy, propenyloxy, allyoxy or butenyloxy), the above described aryl group, an aryloxy group (e.g., phenyloxy) and an aryloxycarbonyl group (e.g., phenyloxycarbonyl).

$R_5$ preferably represents an alkyl group having from 1 to 20 carbon atoms, an aryl group having from 6 to 20 carbon atoms or an aralkyl group having from 7 to 20 carbon atoms. These groups may further have a substituent.

The alicyclic group represented by Z may be a monocyclic ring or a polycyclic ring. Specifically, the alicyclic group includes a group having not less than 5 carbon atoms and including, for example, a monocyclo, bicyclo, tricyclo or tetracyclo structure. The number of carbon atoms included therein is preferably from 6 to 30, and more preferably from 7 to 25. The alicyclic group may have a substituent.

Specific examples of the alicyclic structure include cyclopentane, cyclohexane, cycloheptane, cyclooctane, cyclodecane, cyclododecane and those set forth below.

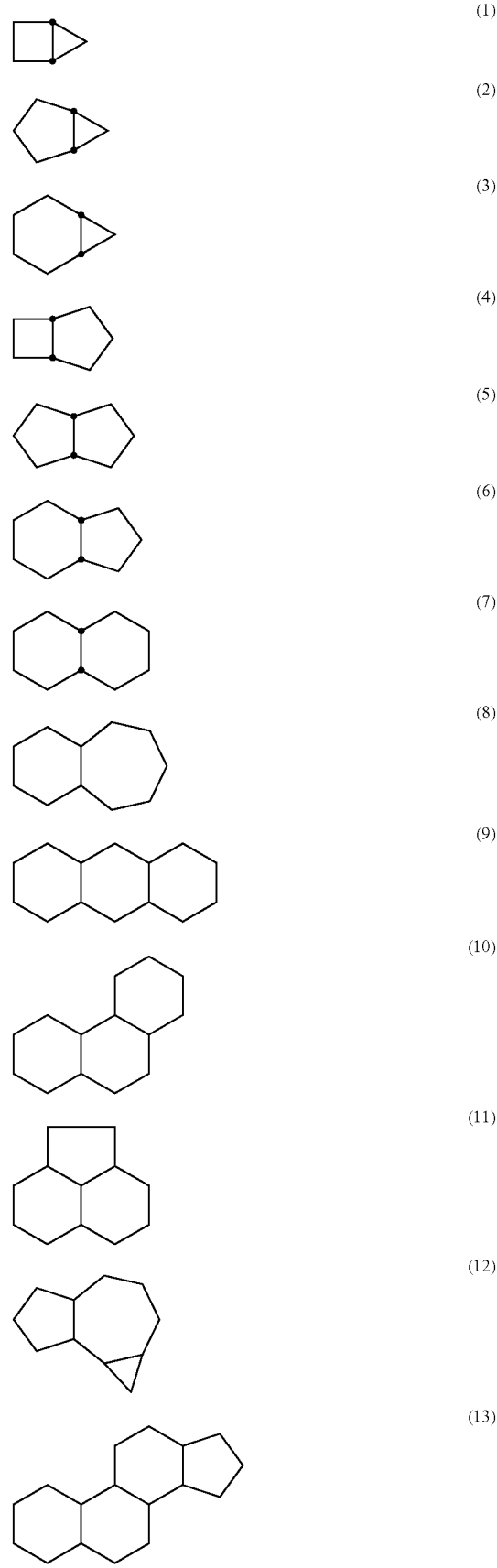

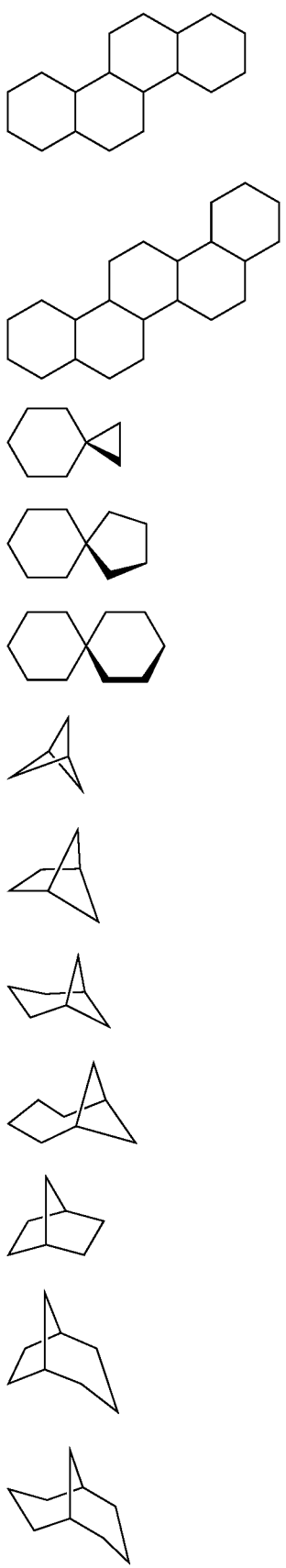
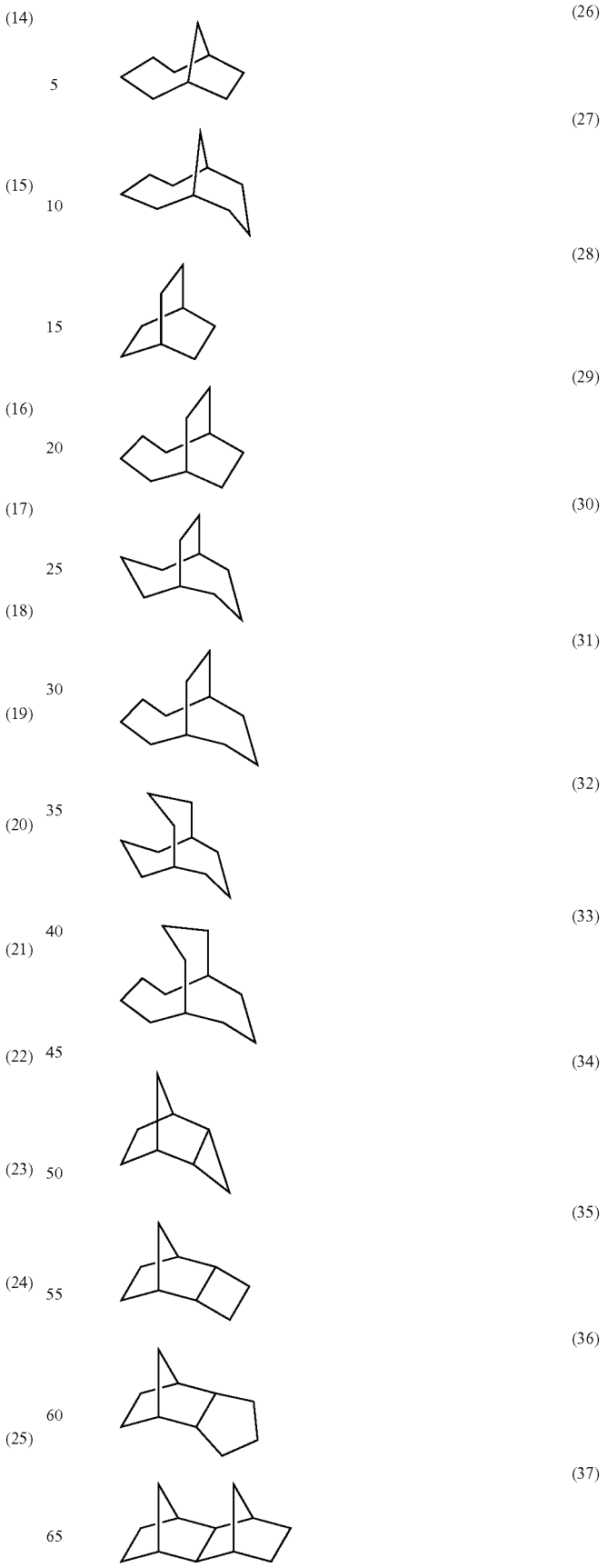

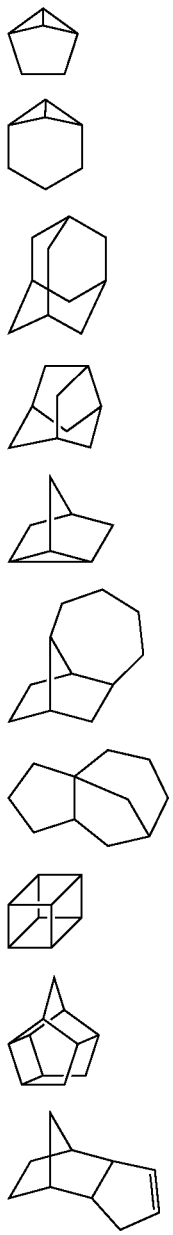

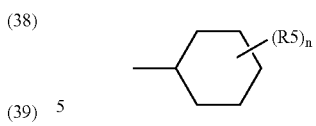

wherein R5 and n have the same meanings as described above, respectively.

Specific examples of the group represented by formula (X) are set forth below, but the invention should not be construed as being limited thereto.

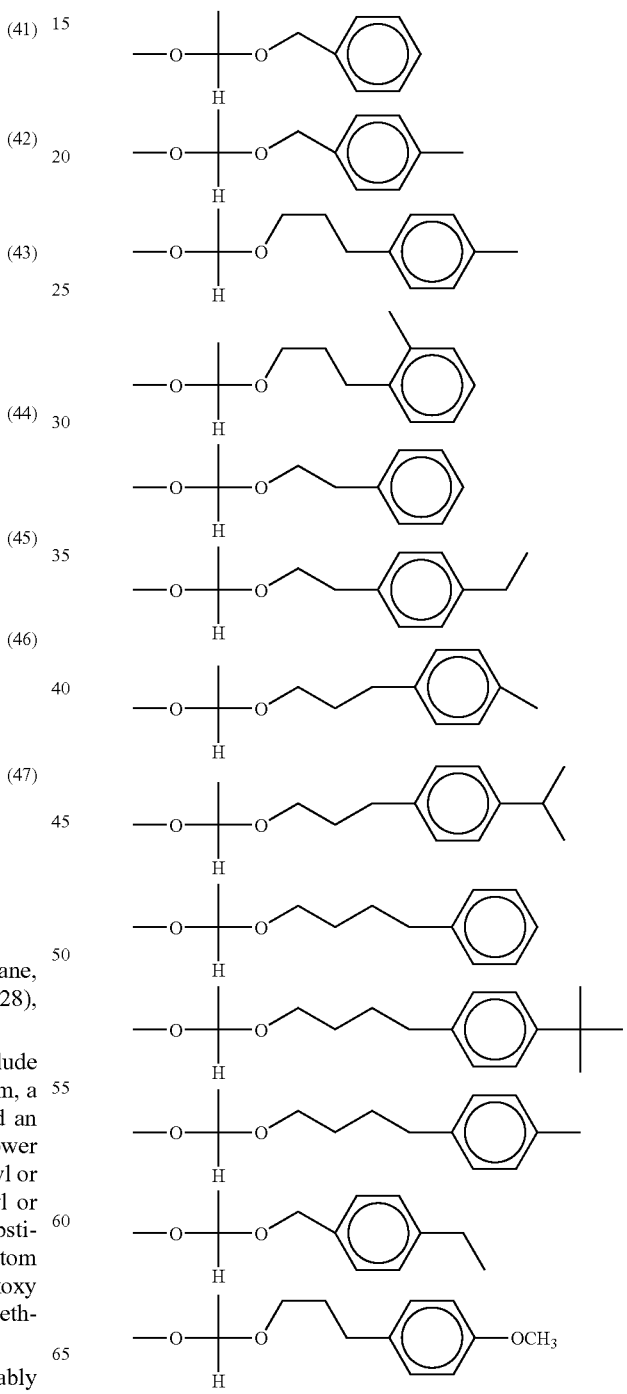

Of the alicyclic structure illustrated above, cyclopentane, cyclohexane, (5), (6), (7), (9), (10), (13), (14), (15), (23), (28), (36), (37), (42) and (47) are preferred.

Examples of the substituent for the alicyclic group include an alkyl group, a substituted alkyl group, a halogen atom, a hydroxy group, an alkoxy group, a carboxy group and an alkoxycarbonyl group. The alkyl group is preferably a lower alkyl group, for example, methyl, ethyl, propyl, isopropyl or butyl group, and more preferably methyl, ethyl, propyl or isopropyl group. Examples of the substituent for the substituted alkyl group include a hydroxy group, a halogen atom and an alkoxy group. The alkoxy group includes an alkoxy group having from 1 to 4 carbon atoms, for example, methoxy, ethoxy, propoxy or butoxy group.

The alicyclic group represented by Z also preferably includes a group represented by the following formula:

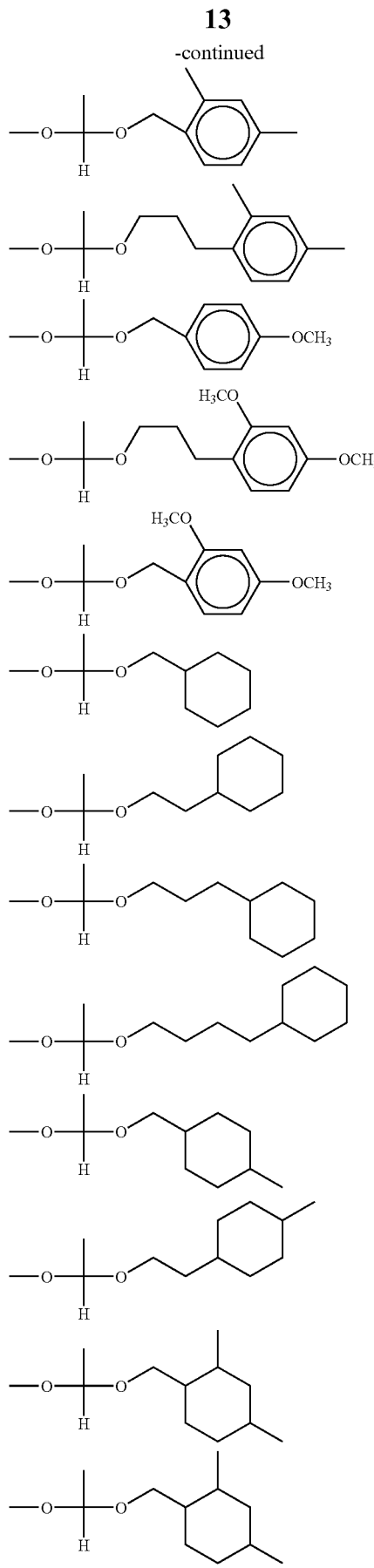

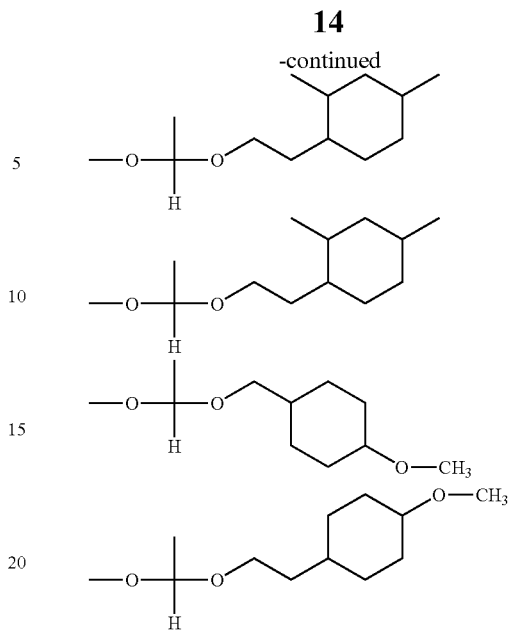

Resin (A) for use in the positive resist composition of the invention is a resin containing a group decomposable with an acid (an acid decomposable group) in the main chain or side chain thereof, or in both the main chain and side chain thereof. Resin (A) may contain other acid decomposable group in addition to the group represented by formula (X).

Preferred examples of the group decomposable with an acid include a group represented by —COOA$^0$ and a group represented by —O—B$^0$. Examples of the group containing these groups include a group represented by —R$^0$—COOA$^0$ and a group represented by —Ar—O—B$^0$.

In the above formulae, A$^0$ represents —C(R$^{01}$)(R$^{02}$)(R$^{03}$), —Si(R$^{01}$)(R$^{02}$)(R$^{03}$) or —C(R$^{04}$)(R$^{05}$)—O—R$^{06}$. B$^0$ represents -A$^0$ or —CO—O-A$^0$. R$^{01}$, R$^{02}$, R$^{03}$, R$^{04}$ and R$^{05}$, which may be the same or deferent, each represent a hydrogen atom, an alkyl group which may have a substituent, a cycloalkyl group which may have a substituent, an alkenyl group which may have a substituent or an aryl group which may have a substituent, and R$^{06}$ represents an alkyl group which may have a substituent or an aryl group which may have a substituent, provided that at least two of R$^{01}$ to R$^{03}$ are the groups other than a hydrogen atom. Alternatively, two groups of R$^{01}$ to R$^{03}$ or R$^{04}$ to R$^{06}$ may be combined with each other to form a ring. R$^0$ represents an aliphatic or aromatic hydrocarbon group having two or more valences which may have a substituent. —Ar— represents a monocyclic or polycyclic aromatic group having two or more valences which may have a substituent.

Preferred examples of the acid decomposable group include a silyl ether group, a cumyl ester group, an acetal group, a tetrahydropyranyl ether group, an enol ether group, an enol ester group, a tertiary alkyl ether group, a tertiary alkyl ester group and a tertiary alkylcarbonate group. More preferred examples thereof include a tertiary alkyl ester group, a tertiary alkylcarbonate group, a cumyl ester group, an acetal group and a tetrahydropyranyl ether group.

In a case wherein the group decomposable with an acid is bonded as a side chain, a parent resin is an alkali-soluble resin having an alkali-soluble group, for example, an —OH group or a —COOH group, preferably —R$^0$—COOH group or —Ar—OH group in the side chain thereof. Examples of the parent resin include alkali-soluble resins described hereinafter.

An alkali-dissolution rate of the alkali-soluble resin is preferably not less than 170 A/sec (wherein A represents angstrom), and particularly preferably not less than 330 A/sec, when measured in a 0.261 N aqueous solution of tetramethylammonium hydroxide (TMAH) at 23° C.

From these standpoints, particularly referred examples of the alkali-soluble resin include a poly(o-, m-, or p-hydroxystyrene), a copolymer of o-, m-, or p-hydroxystyrene, a hydrogenated poly(hydroxystyrene), a halogen- or alkyl-substituted poly(hydroxystyrene), a partially O-alkylated or O-acylated poly(hydroxystyrene), a styrene-hydroxystyrene copolymer, an α-methylstyrene-hydroxystyrene copolymer and a hydrogenated novolak resin.

Component (A) for use in the invention can be obtained by reacting an alkali-soluble resin with a precursor of the group decomposable with an acid, or by copolymerizing a monomer for forming an alkali-soluble resin, which has the group decomposable with an acid, with any of various monomers, as described, for example, in European Patent 254,853, JP-A-2-25850, JP-A-3-223860 and JP-A-4-251259.

Specific examples of Component (A) for use in the invention are set forth below, but the invention should not be construed as being limited thereto.

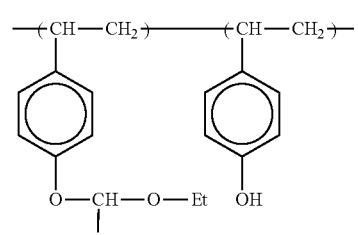
(B-4)

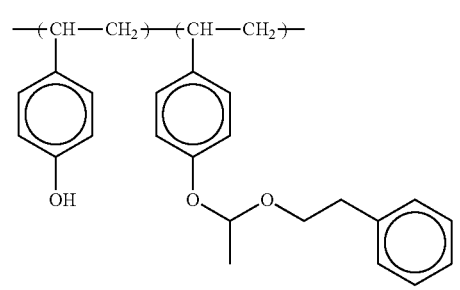
(B-28)

(B-29)

(B-30)

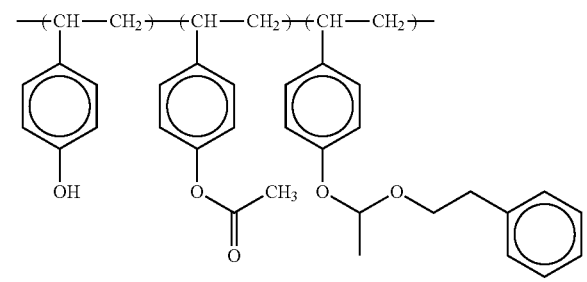
(B-31)

(B-32)

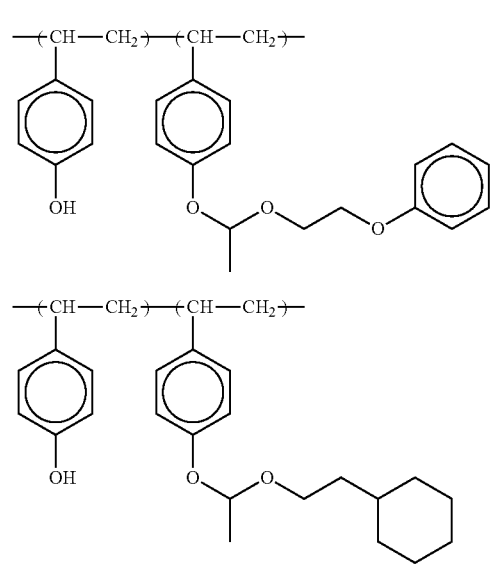

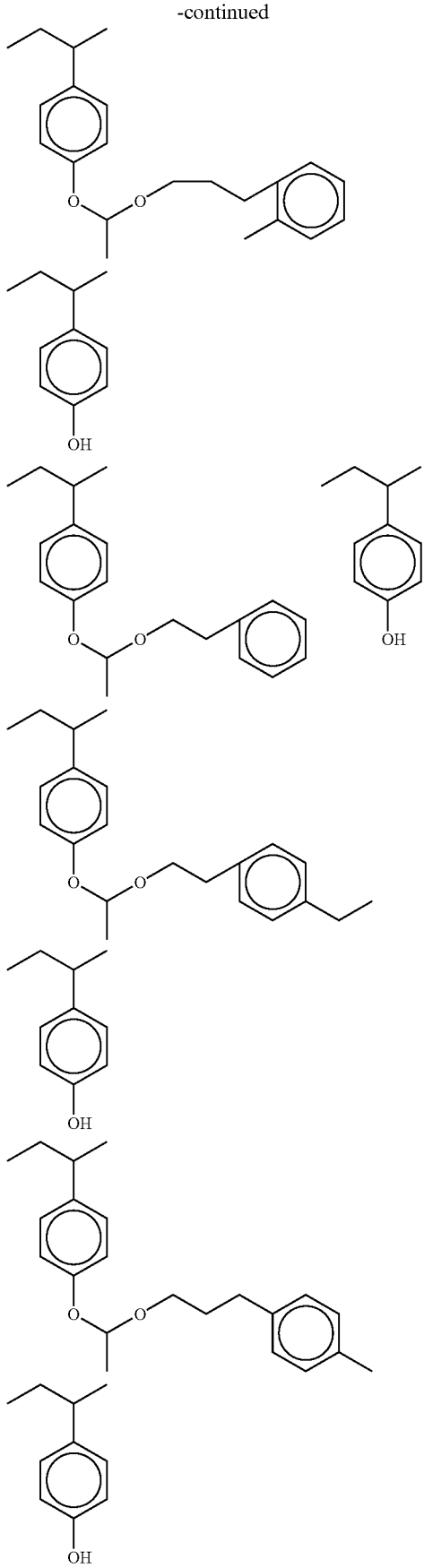
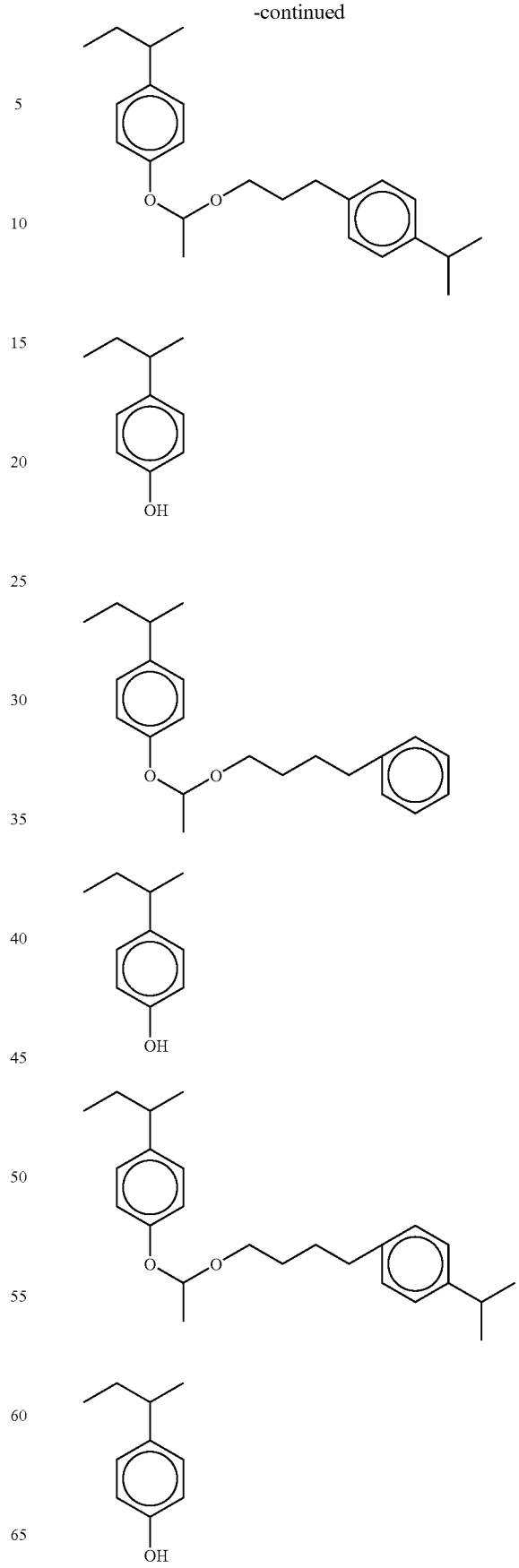

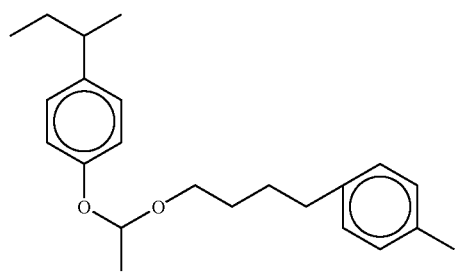
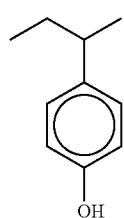
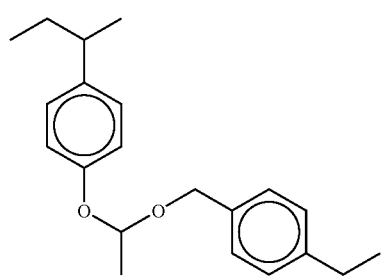
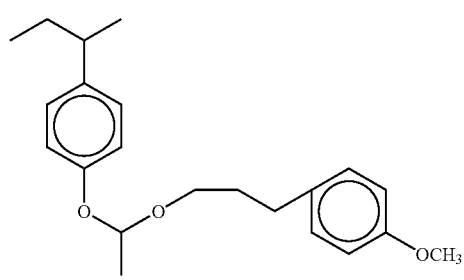
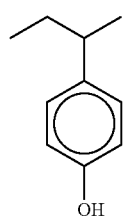
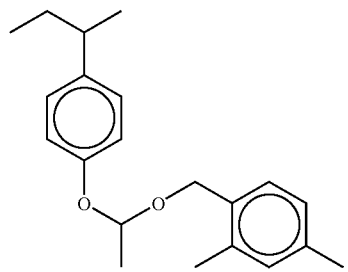
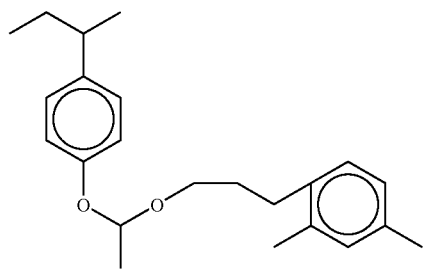
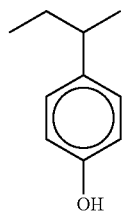
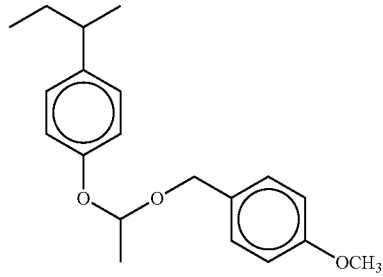
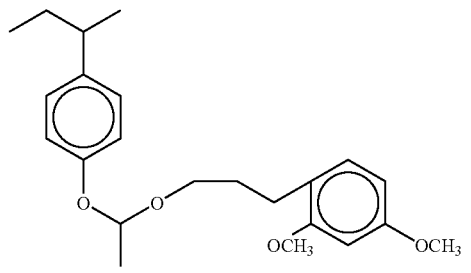
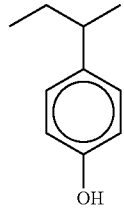
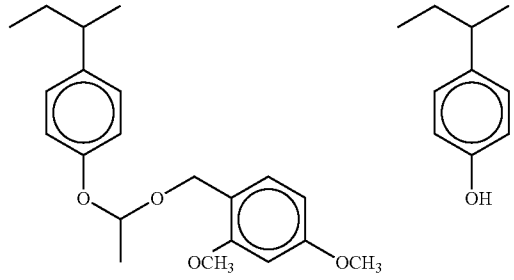

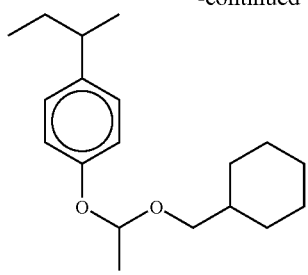 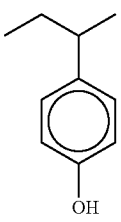
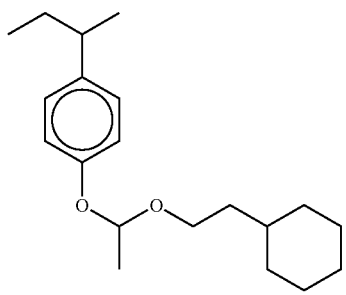 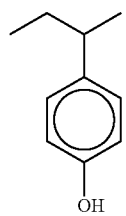
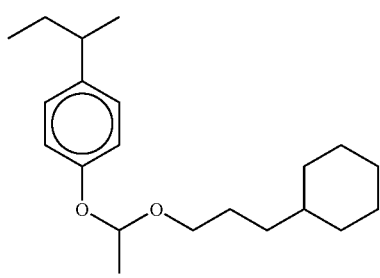 
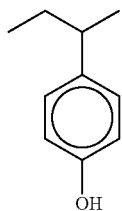
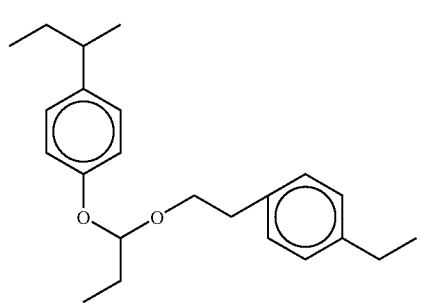 
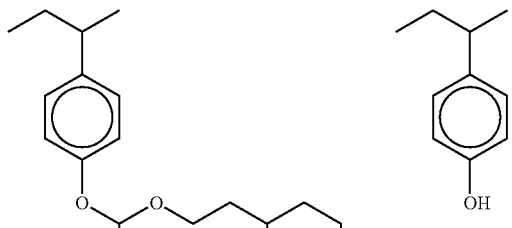 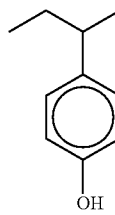
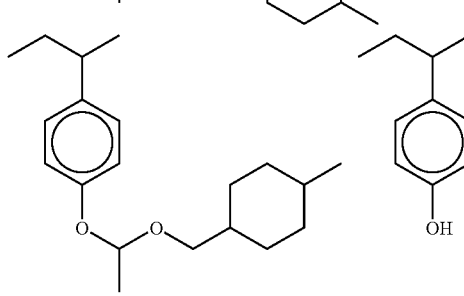 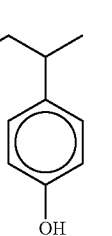
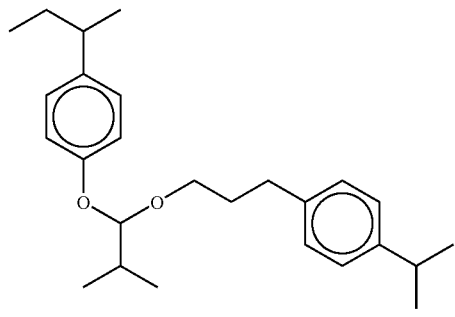 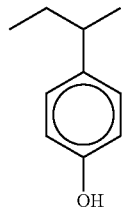

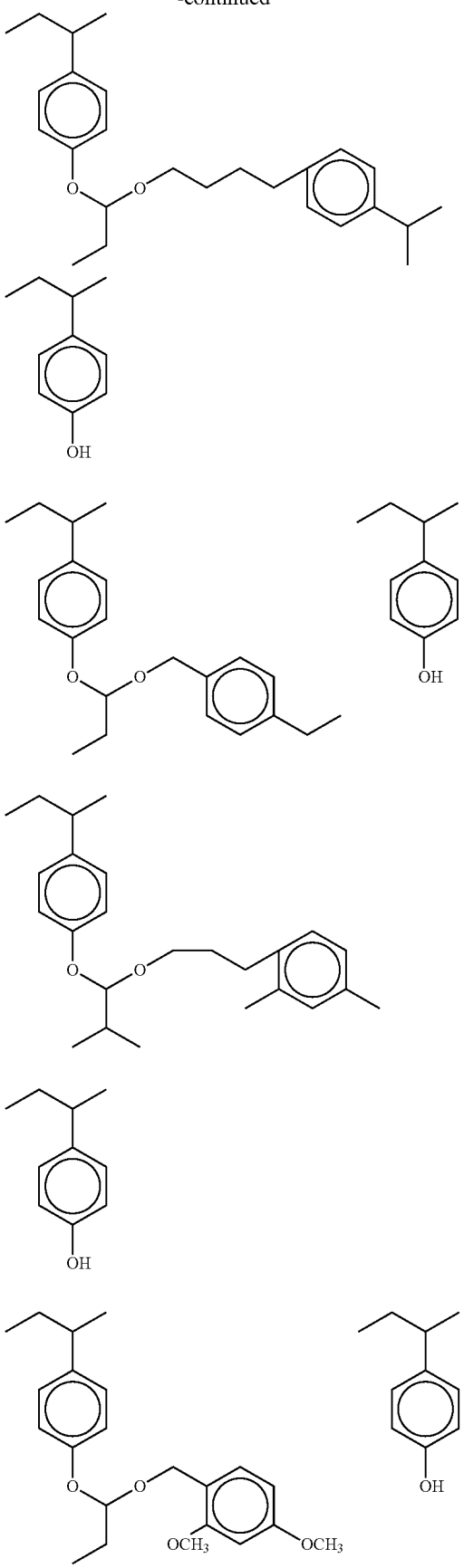

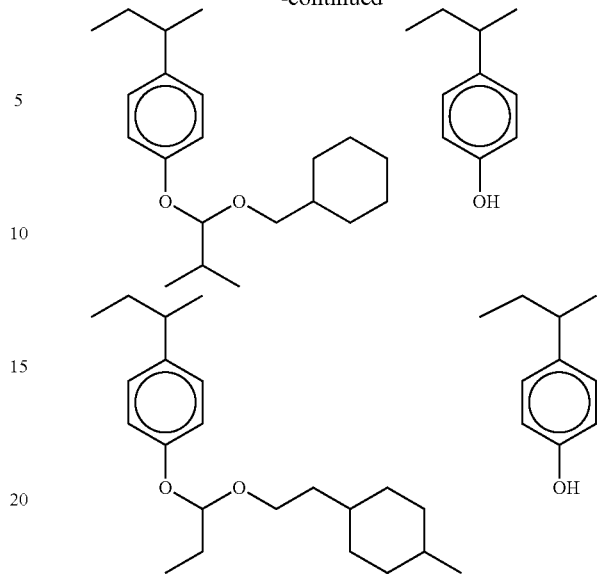

A ratio of content (protective ratio) of the group decomposable with an acid (acid decomposable group) in the resin of Component (A) is indicated by a formula of A/(A+S) wherein A represents a number of the group capable of being decomposed with an acid to form an alkali-soluble group and S represents a number of an alkali-soluble group that is not protected by the group decomposable with an acid. The ratio of content is preferably from 0.01 to 0.4, more preferably from 0.05 to 0.40, and still more preferably from 0.05 to 0.38.

The weight average molecular weight (Mw) of Component (A) is preferably in a range of from 1,500 to 5,000.

The molecular weight distribution (Mw/Mn) is preferably from 1.0 to 4.0, more preferably from 1.0 to 2.0, and particularly preferably from 1.0 to 1.6.

The weight average molecular weight is expressed using a value determined by gel permeation chromatography and calculated in terms of polystyrene.

Two or more of the polymers of Component (A) may be used in combination in the positive resist composition of the invention.

The amount of the polymer of Component (A) is suitably from 80 to 98% by weight, preferably from 85 to 96% by weight, based on the solid content of the positive resist composition of the invention.

[2] Component (B): Compound that Generates an Acid Upon Irradiation of an Actinic Ray or Radiation The positive resist composition of the invention contains a compound (an acid generator) that generates an acid upon irradiation of an actinic ray or radiation (including electron beam, X ray or EUV). Acid generator (B) is a compound that generates an acid when a resist film containing the acid generator is subjected to irradiation of an actinic ray or radiation. Specifically, the acid generator may include a compound that directly generates an acid upon the irradiation and a compound that generate an acid with a second order electron released from a constituting component, for example, a resin upon the irradiation.

The compound for use in the invention can be appropriately selected from photoinitiators for photocation polymerization, photoinitiators for photo-radical polymerization, photo-achromatizing agents for dyes, photo-discoloring agents, compounds that generate an acid upon irradiation of known light used in a microresist or the like (for example, an ultraviolet ray of from 400 to 200 nm or a far ultraviolet ray, particularly preferably a g-line, an h-line, an i-line or a KrF excimer laser beam), an ArF excimer laser beam, an X ray, an electron beam, an EUV beam, a molecular beam or an ion beam, and mixtures thereof.

It is preferred in the invention that the positive resist composition contains a compound that generates a sulfonic acid upon irradiation of an actinic ray or radiation (Compound (B-1)) as the acid generator.

Also, compounds in which a group or compound generating a sulfonic acid upon irradiation of an active ray or radiation is introduced into the main chain or side chain of a polymer, for example, compounds as described, for example, in JP-A-63-26653, JP-A-55-164824, JP-A-62-69263, JP-A-63-146038, JP-A-63-163452, JP-A-62-153853 and JP-A-63-146029 can be used.

Further, compounds capable of generating an acid with light as described, for example, in U.S. Pat. No. 3,779,778 and European Patent 126,712 can be used.

Moreover, known onium salts, for example, diazonium salts, phosphonium salts, iodonium salts, sulfonium salts or selenonium salts, organic halogen compounds, O-nitrobenzylsulfonate compounds, N-iminosulfonate compounds, N-imidosulfonate compounds, diazosulfone compounds, diazodisulfone compounds and disulfone compounds each generating a sulfonic acid can be used.

Preferred examples of the compound include sulfonate compounds of sulfonium or iodonium, sulfonic acid ester compounds of N-hydroxyimide and disulfonyldiazomethane compounds.

Among the compounds, in particular, N-imidosulfonate compounds as described, for example, in JP-A-10-7653 and JP-A-11-2901, diazodisulfone compounds as described, for example, in JP-A-4-210960 and European Patent 417,557, and sulfonium salts and iodonium salts represented by formulae (I) to (III) shown below are preferred. The sulfonium salts and iodonium salts represented by formulae (I) to (III) are most preferred.

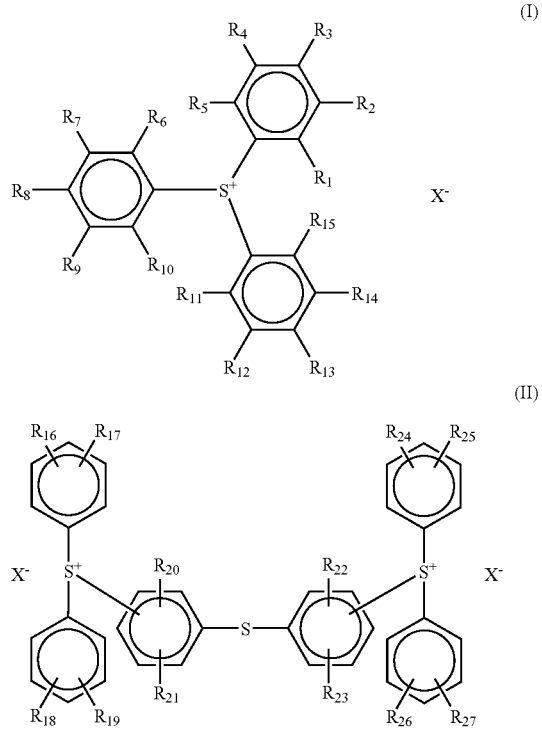

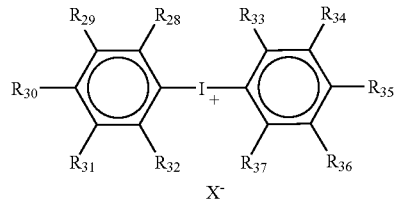

In formulae (I) to (III), $R_1$ to $R_{37}$ each independently represent a hydrogen atom, an alkyl group, an alkoxy group, a hydroxy group, a halogen atom or a group represented by —S—$R_{38}$.

The alkyl group represented by any one of $R_1$ to $R_{37}$ may be a straight chain, branched or cyclic alkyl group. The straight chain or branched alkyl group includes, for example, an alkyl group having from 1 to 4 carbon atoms, e.g., methyl, ethyl, propyl, n-butyl, sec-butyl or tert-butyl group. The cyclic alkyl group includes, for example, a cyclic alkyl group having from 3 to 8 carbon atoms, e.g., cyclopropyl, cyclopentyl or cyclohexyl group.

The alkoxy group represented by any one of $R_1$ to $R_{37}$ may be a straight chain, branched or cyclic alkoxy group. The straight chain or branched alkoxy group includes an alkoxy group having from 1 to 8 carbon atoms, e.g., methoxy, ethoxy, hydroxyethoxy, propoxy, n-butoxy, isobutoxy, sec-butoxy, tert-butoxy or octyloxy group. The cyclic alkoxy group includes, for example, cyclopentyloxy or cyclohexyloxy group.

The halogen atom represented by any one of $R_1$ to $R_{37}$ includes fluorine, chlorine, bromine and iodine atoms.

$R_{38}$ in the —S—$R_{38}$ represented by $R_1$ to $R_{37}$ represents an alkyl group or an aryl group. The alkyl group represented by $R_{38}$ includes, for example, those described for the alkyl group represented by any one of $R_1$ to $R_{37}$.

The aryl group represented by $R_{38}$ includes an aryl group having from 6 to 14 carbon atoms, e.g., phenyl, tolyl, methoxyphenyl or naphthyl group.

The alkyl group, alkoxy group and aryl group represented by any one of $R_1$ to $R_{38}$ each may further have a substituent. Preferred examples of the substituent include an alkoxy group having from 1 to 4 carbon atoms, an aryl group having from 6 to 10 carbon atoms, an alkenyl group having from 2 to 6 carbon atoms, a cyano group, a hydroxy group, a carboxy group, an alkoxycarbonyl group, a nitro group and a halogen atom (e.g., fluorine, chlorine or iodine atom).

In the groups represented by $R_1$ to $R_{15}$ in formula (I), at least two groups thereof may combine with each other to form a ring. The ring may be formed by directly combining the terminals of the groups represented $R_1$ to $R_{15}$. Also, the ring may be formed by indirectly combining the groups represented $R_1$ to $R_{15}$ through one or more atoms selected from carbon, oxygen, sulfur and nitrogen atoms. The ring structure formed by combining two or more groups represented by $R_1$ to $R_{15}$ includes, for example, a furan ring, a dihydrofuran ring, a pyran ring, a trihydropyran ring, a thiophene ring and a pyrrole ring. The same as above can be applied to $R_{16}$ to $R_{27}$ in formula (II), and two or more groups represented by $R_{16}$ to $R_{27}$ may combine with each other directly or indirectly to form a ring. The same as above can also be applied to $R_{28}$ to $R_{37}$ in formula (III).

Each of formulae (I) to (III) has X⁻. The X⁻ in any one of formulae (I) to (III) is an anion of an acid.

The acid forming the anion is a sulfonic acid and preferably includes a benzenesulfonic acid, a naphthalenesulfonic acid and an anthracenesulfonic acid each having at least one fluorine atom. The benzenesulfonic acid, naphthalenesulfonic acid and anthracenesulfonic acid may be those substituted directly with a fluorine atom or those substituted with a substituent having a fluorine atom.

Examples of the substituent includes an organic group substituted with a fluorine atom, for example, an alkyl group, an alkoxy group, an acyl group, an acyloxy group, a sulfonyl group, a sulfonyloxy group, a sulfonylamino group, an aryl group, an aralkyl group and an alkoxycarbonyl group each substituted with a fluorine atom.

The benzenesulfonic acid, naphthalenesulfonic acid and anthracenesulfonic acid described above may further be substituted, for example, with a halogen atom other than a fluorine atom, a hydroxy group or a nitro group.

The alkyl group bonded to the acid such as benzenesulfonic acid forming the anion of X⁻ includes, for example, an alkyl group having from 1 to 12 carbon atoms. The alkyl group may be a straight chain, branched or cyclic alkyl group. The alkyl group is substituted with at least one fluorine atom, and preferably substituted with not more than 25 fluorine atoms. Specific examples of the alkyl group include trifluoromethyl, pentafluoroethyl, 2,2,2-trifluoroethyl, heptafluoropropyl, heptafluoroisopropyl, perfluorobutyl, perfluorooctyl, perfluorododecyl and perfluorocyclohexyl groups. Of these groups, a perfluoroalkyl group having from 1 to 4 carbon atoms wherein all hydrogen atoms are replaced with fluorine atoms is preferred.

The alkoxy group bonded to the acid such as benzenesulfonic acid individually or together with the alkyl group includes an alkoxy group having from 1 to 12 carbon atoms. The alkoxy group may be a straight chain, branched or cyclic alkoxy group. The alkoxy group is substituted with at least one fluorine atom, and preferably substituted with not more than 25 fluorine atoms. Specific examples of the alkoxy group include trifluoromethoxy, pentafluoroethoxy, heptafluoroisopropyloxy, perfluorobutoxy, perfluorooctyloxy, perfluorododecyloxy and perfluorocyclohexyloxy groups. Of these groups, a perfluoroalkoxy group having from 1 to 4 carbon atoms wherein all hydrogen atoms are replaced with fluorine atoms is preferred.

The acyl group bonded to the acid such as benzenesulfonic acid individually or together with the alkyl group includes preferably an acyl group having from 2 to 12 carbon atoms and substituted with from 1 to 23 fluorine atoms. Specific examples of the acyl group include trifluoroacetyl, pentafluoropropionyl and pentafluorobenzoyl groups.

The acyloxy group bonded to the acid such as benzenesulfonic acid individually or together with the alkyl group includes preferably an acyloxy group having form 2 to 12 carbon atoms and substituted with from 1 to 23 fluorine atoms. Specific examples of the acyloxy group include trifluoroacetoxy, pentafluoropropionyloxy and pentafluorobenzoyloxy groups.

The sulfonyl group bonded to the acid such as benzenesulfonic acid individually or together with the alkyl group includes preferably a sulfonyl group having from 1 to 12 carbon atoms and substituted with from 1 to 25 fluorine atoms. Specific examples of the sulfonyl group include trifluoromethanesulfonyl, pentafluoroethanesulfonyl, perfluorobutanesulfonyl, perfluorooctanesulfonyl, pentafluorobenzenesulfonyl and 4-trifluoromethylbenzenesulfonyl groups.

The sulfonyloxy group bonded to the acid such as benzenesulfonic acid individually or together with the alkyl group includes preferably a sulfonyloxy group having from 1 to 12 carbon atoms and substituted with from 1 to 25 fluorine atoms. Specific examples of the sulfonyloxy group include trifluoromethanesulfonyloxy, perfluorobutanesulfonyloxy and 4-trifluoromethylbenzenesulfonyloxy groups.

The sulfonylamino group bonded to the acid such as benzenesulfonic acid individualy or together with the alkyl group includes preferably a sulfonylamino group having from 1 to 12 carbon atoms and substituted with from 1 to 25 fluorine atoms. Specific examples of the sulfonylamino group include trifluoromethanesulfonylamino, perfluorobutanesulfonylamino, perfluorooctanesulfonylamino and pentafluorobenzenesulfonylamino groups.

The aryl group bonded to the acid such as benzenesulfonic acid individually or together with the alkyl group includes preferably an aryl group having from 6 to 14 carbon atoms and substituted with from 1 to 9 fluorine atoms. Specific examples of the aryl group include pentafluorophenyl, 4-trifluoromethylphenyl, heptafluoronaphthyl, nonafluoroanthranyl, 4-fluorophenyl and 2,4-difluorophenyl groups.

The aralkyl group bonded to the acid such as benzenesulfonic acid individually or together with the alkyl group includes preferably an aralkyl group having from 7 to 10 carbon atoms and substituted with from 1 to 15 fluorine atoms. Specific examples of the aralkyl group include pentafluorophenylmethyl, pentafluorophenylethyl, perfluorobenzyl and perfluorophenthyl groups.

The alkoxycarbonyl group bonded to the acid such as benzenesulfonic acid individually or together with the alkyl group includes preferably an alkoxycarbonyl group having from 2 to 13 carbon atoms and substituted with from 1 to 25 fluorine atoms. Specific examples of the alkoxycarbonyl group include trifluoromethoxycarbonyl, pentafluoroethoxycarbonyl, pentafluorophenoxycarbonyl, perfluorobutoxycarbonyl and perfluorooctyloxycarbonyl groups.

Among the anions, more preferred X⁻ is a fluorine-substituted benzenesulfonic acid anion, and pentafluorobenzenesulfonic acid anion is particularly preferred.

The benzenesulfonic acid, naphthalenesulfonic acid and anthracenesulfonic acid having a fluorine-containing substituent may be further substituted, for example, with a straight chain, branched or cyclic alkoxy group, an acyl group, an acyloxy group, a sulfonyl group, a sulfonyloxy group, a sulfonylamino group, an aryl group, an aralkyl group, an alkoxycarbonyl group (the ranges of carbon atom number of these groups are the same as those described above), a halogen atom (excluding fluorine atom), a hydroxy group or a nitro group.

Specific examples of the compounds represented by formulae (I) to (III) are set forth below, but the invention should not be construed as being limited thereto.

(I-1)

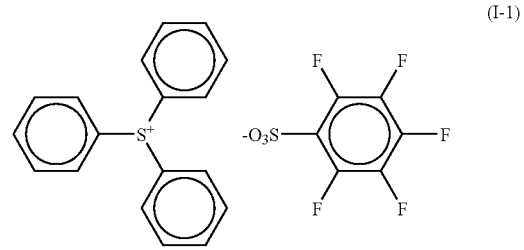

(I-2)
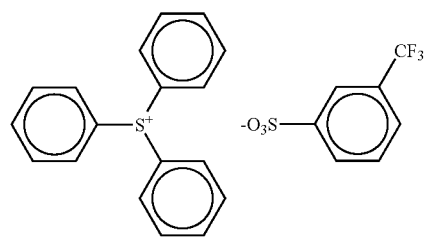
(I-8)
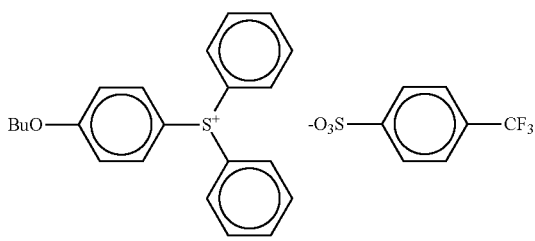
(I-3)
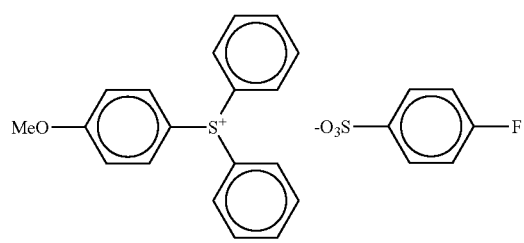
(I-9)
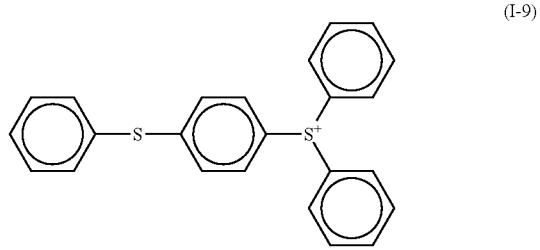
(I-4)
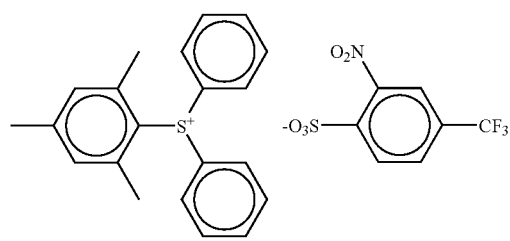
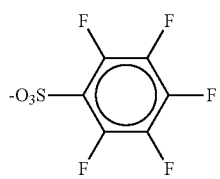
(I-5)
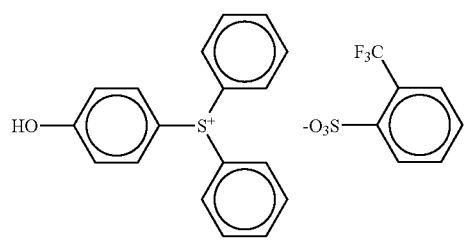
(I-10)
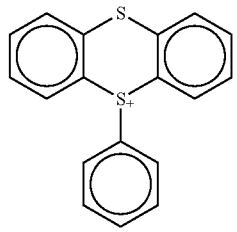
(I-6)
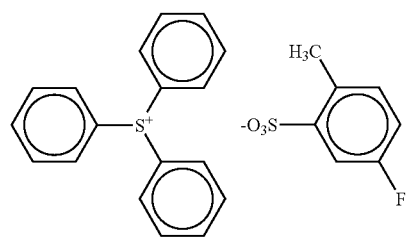
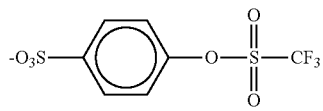
(I-7)
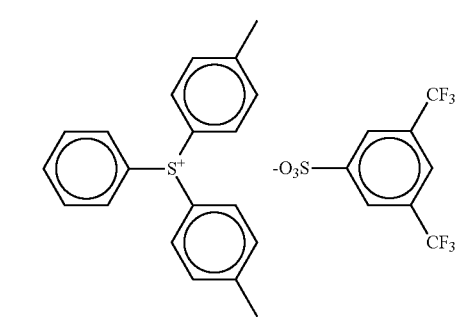
(I-11)
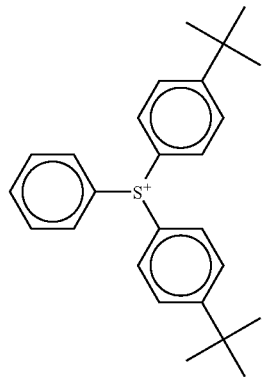
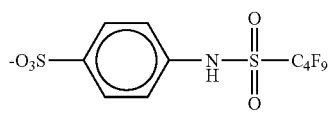

(I-12)
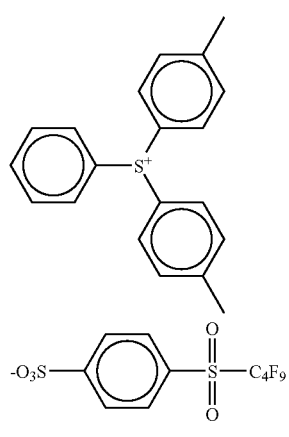
(I-13)
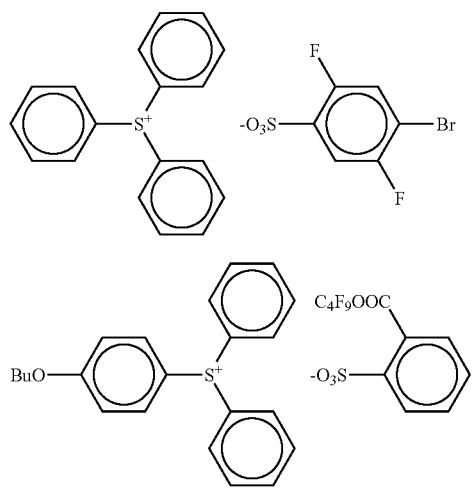
(I-14)
(II-1)
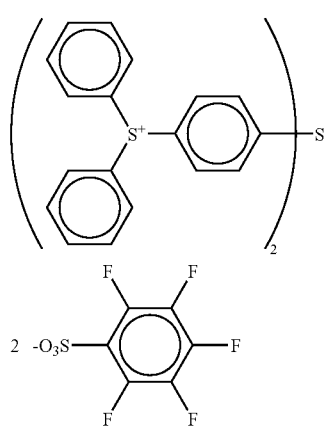
(II-2)
(II-3)
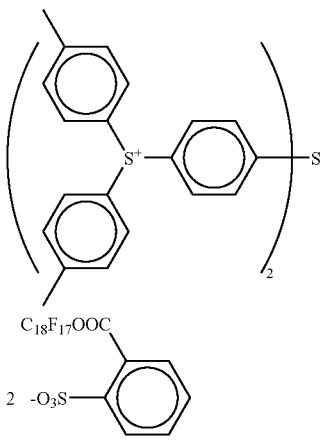
(II-4)
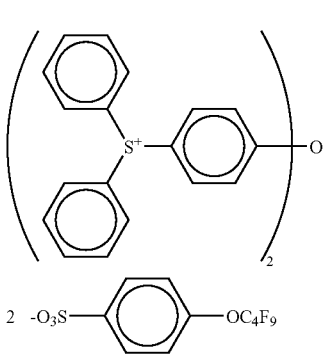
(II-5)
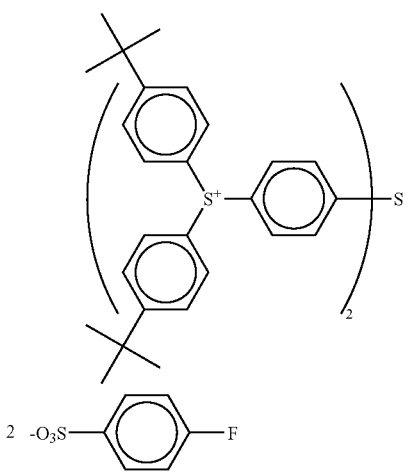
(III-1)
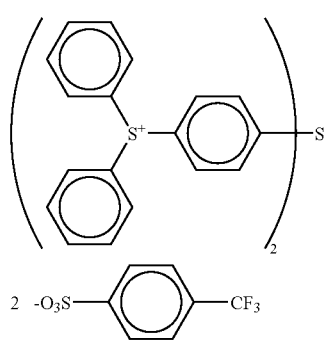
(III-2)
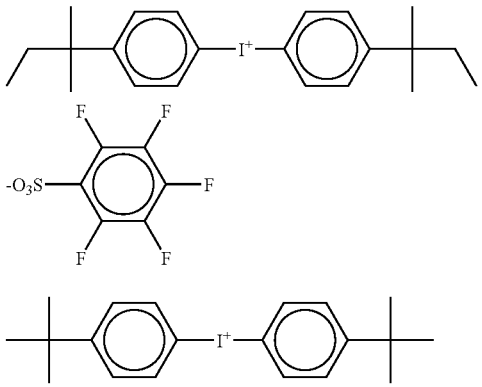

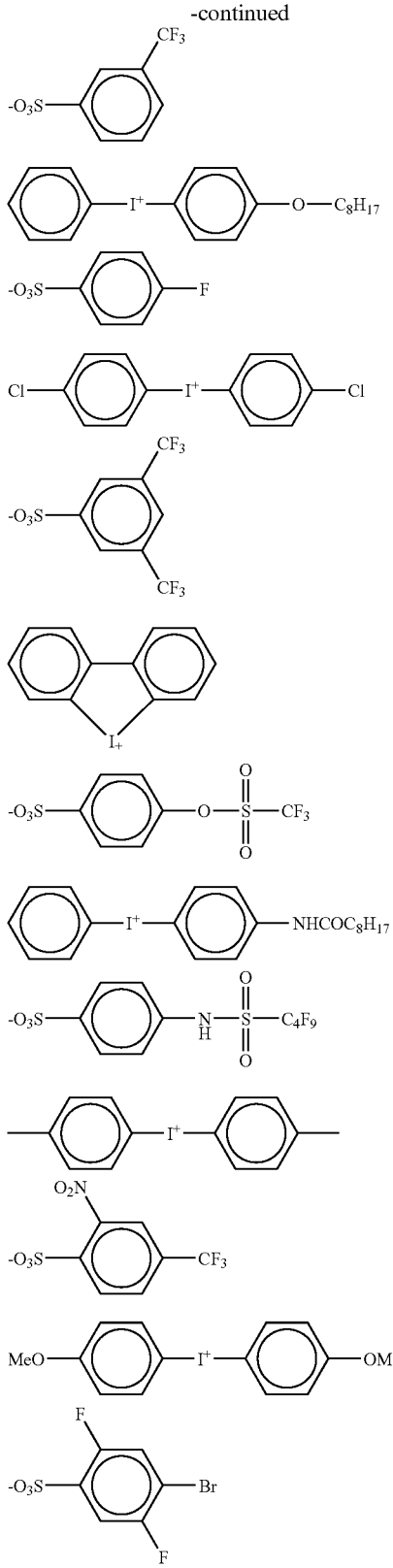

acyl group, an acyloxy group, an aryl group, a hydroxy group, a nitro group and a halogen atom (e.g., chlorine or bromine atom).

Further, an anion wherein X⁻ is an onium salt of an anion of an alkanesulfonic acid having from 1 to 20 carbon atoms is used. In such a case, an onium salt containing an anion of an alkanesulfonic acid substituted with a fluorine atom is more preferred.

In addition to the specific examples described above, specific examples of the compounds represented by formulae (I) to (III) and other onium salts are set forth below, but the invention should not be construed as being limited thereto.

(PAG3-1)
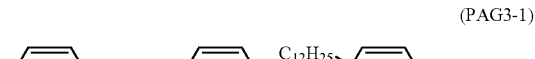

(PAG3-2)

(PAG3-4)
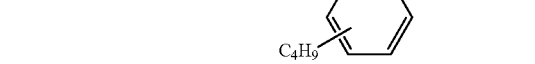

(PAG3-5)

(PAG3-7)

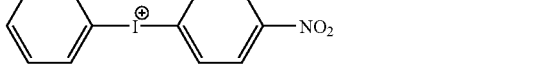

(PAG3-9)
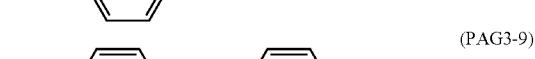

An onium salt wherein the anion of acid represented by X⁻ in any one of formulae (I) to (III) is an anion of an unsubstituted benzenesulfonic acid or a benzenesulfonic acid having a substituent other than a fluorine atom is also used. Examples of the substituent include an alkyl group, an alkoxy group, an -continued
(PAG3-10)
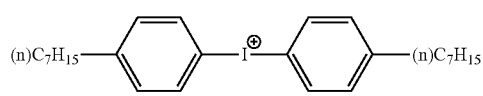
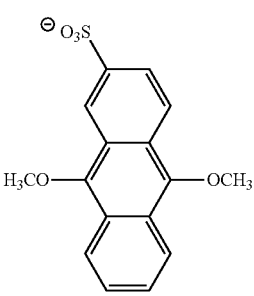
(PAG3-11)
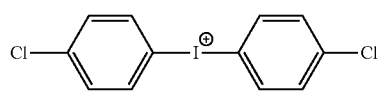
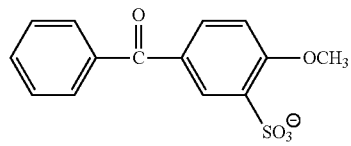
(PAG3-12)
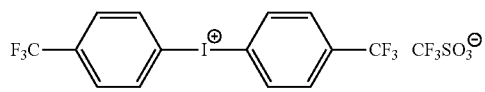
(PAG3-13)
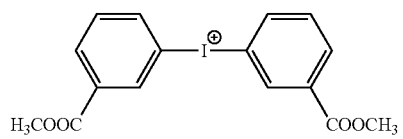
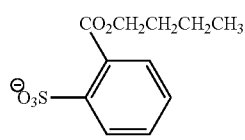
(PAG3-14)
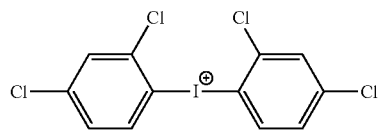
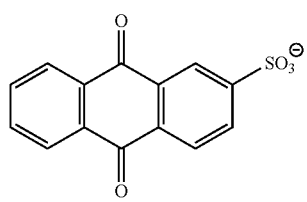
(PAG3-15)
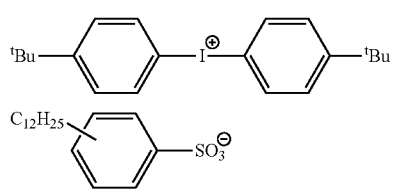
-continued
(PAG3-16)
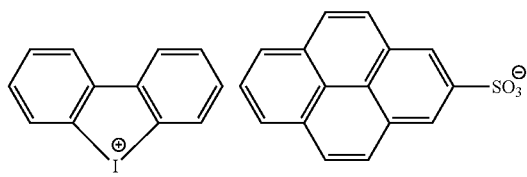
(PAG3-17)
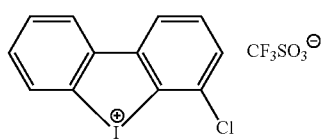
(PAG3-18)
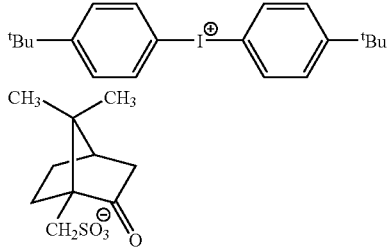
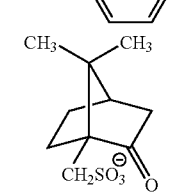
(PAG3-19)
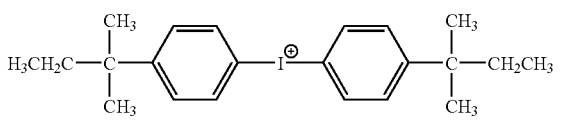
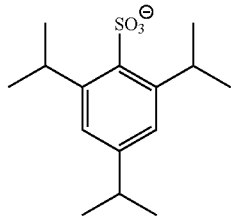
(PAG3-20)
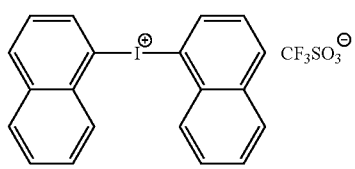
(PAG3-21)
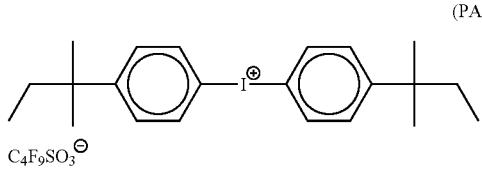
(PAG3-23)
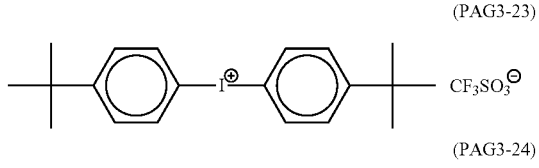
(PAG3-24)
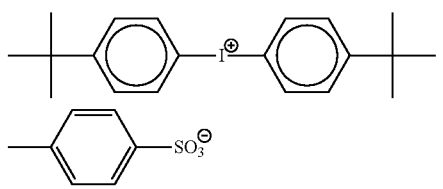
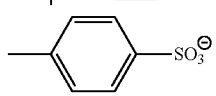

(PAG3-25)
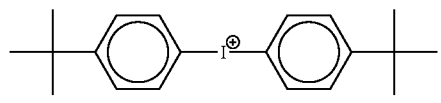
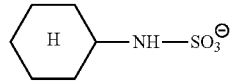
(PAG4-1)
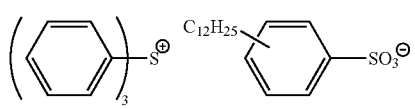
(PAG4-2)
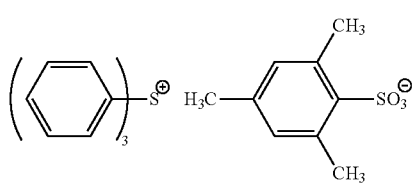
(PAG4-4)
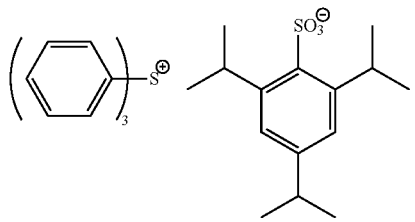
(PAG4-5)
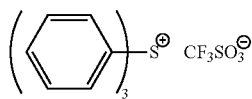
(PAG4-6)
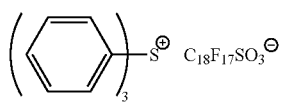
(PAG4-8)
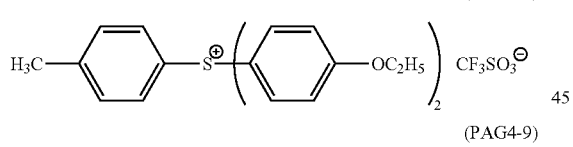
(PAG4-9)
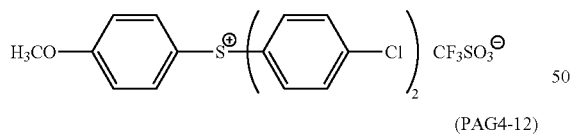
(PAG4-12)
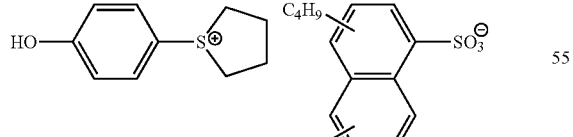
(PAG4-13)
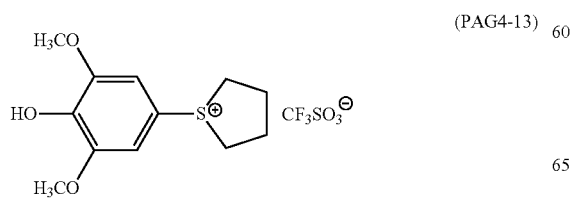
(PAG4-16)
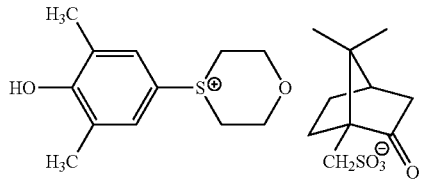
(PAG4-17)
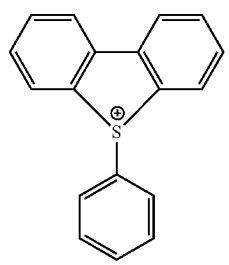
(PAG4-20)
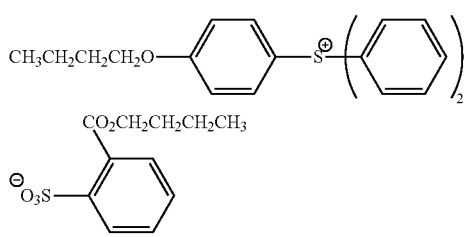
(PAG4-22)
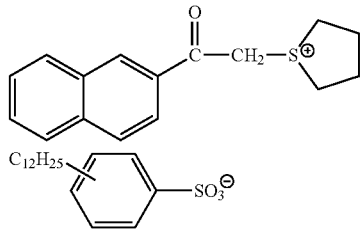
(PAG4-24)
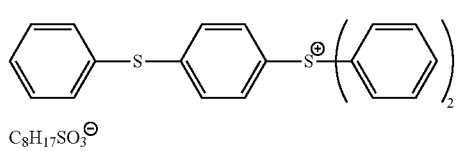
(PAG4-25)
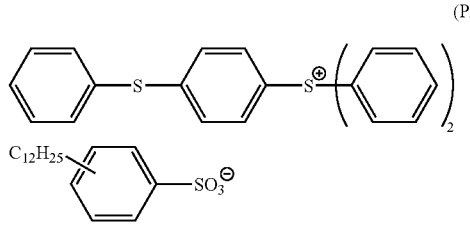
(PAG4-26)
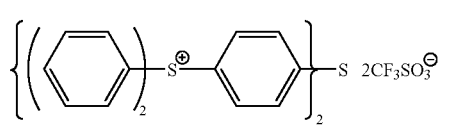
(PAG4-27)
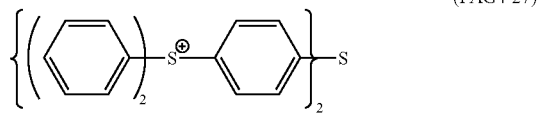

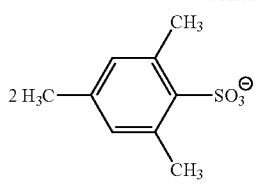
(PAG4-28)

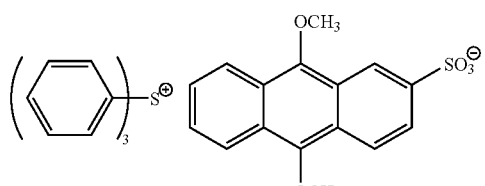
(PAG4-29)

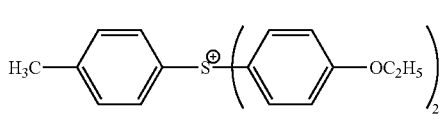
(PAG4-30)

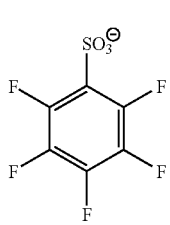
(PAG4-31)

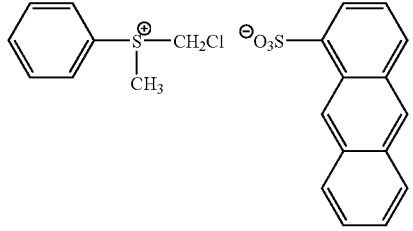
(PAG4-32)

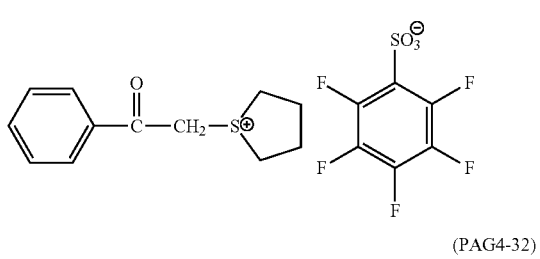
(PAG4-33)

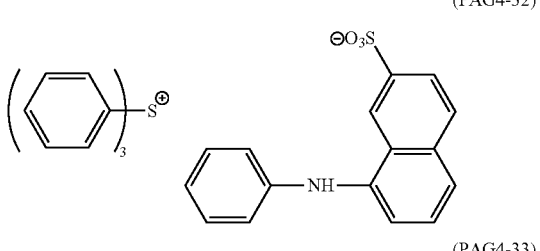

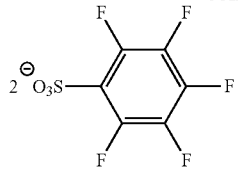
(PAG4-34)

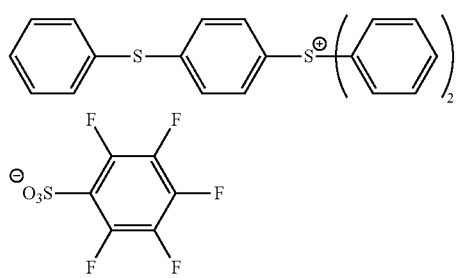
(PAG4-35)

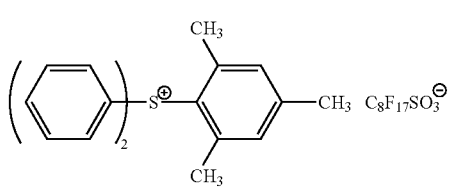
(PAG4-36)

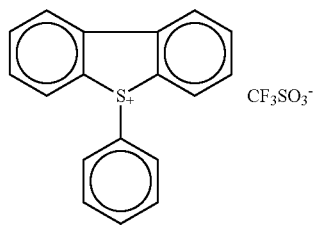
PAG4-37

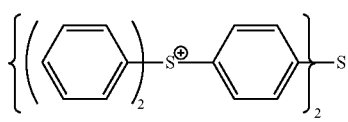

The compounds represented by formulae (I) and (II) can be synthesized by the following methods. For instance, a method wherein an aryl Grignard reagent, e.g., arylmagnesium bromide is reacted with phenyl sulfoxide and the resulting triarylsulfonium halide is subjected to salt-exchange with a corresponding sulfonic acid is used. There is another method wherein phenyl sulfoxide and a corresponding aromatic compound are condensed using an acid catalyst, e.g., methanesulfonic acid/diphosphorus pentaoxide or aluminum chloride and the product is subjected to a salt-exchange. Alternatively, the compound can be synthesized by a method wherein a diaryl iodonium salt and diaryl sulfide are condensed using a catalyst, e.g., copper acetate and the product is subjected to a salt exchange. In any one of the above-described methods, phenyl sulfoxide may have a substituent on the benzene ring thereof or may not have such a substituent.

The compound represented by formula (III) can be synthesized by reacting an aromatic compound with a periodate.

Of the disulfone compound, N-imidosulfonate compound and diazodisulfone compound for the compound of Component (B), the compounds represented by formula (PAG5), (PAG6) and (PAG7) shown below are preferred, respectively.

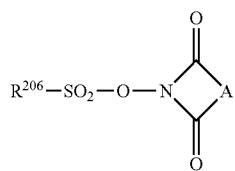 (PAG5)

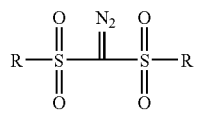 (PAG6)

In the above formulae, Ar$^3$ and Ar$^4$ each independently represent a substituted or unsubstituted aryl group. R$^{206}$ represents a substituted or unsubstituted alkyl group or a substituted or unsubstituted aryl group. A represents a substituted or unsubstituted alkylene group, a substituted or unsubstituted alkenylene group or a substituted or unsubstituted arylene group.

(PAG7)

In the above formula, R represents a straight chain, branched or cyclic alkyl group or an aryl group which may be substituted.

Specific examples of the compounds represented by formulae (PAG5), (PAG6) and (PAG7) are set forth below, but the invention should not be construed as being limited thereto.

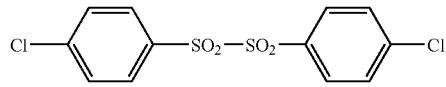 (PAG5-1)

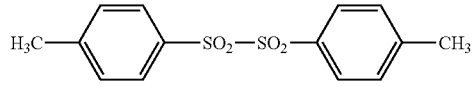 (PAG5-2)

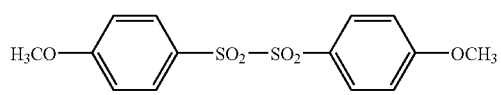 (PAG5-3)

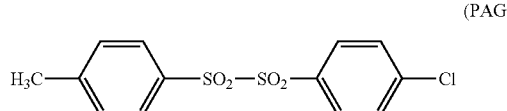 (PAG5-4)

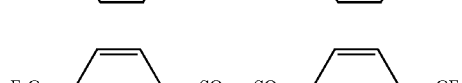 (PAG5-5)

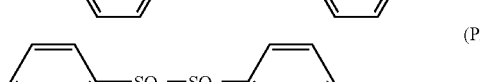 (PAG5-6)

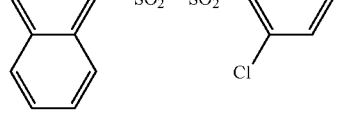

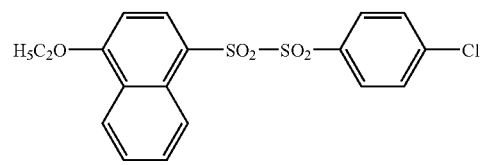 (PAG5-7)

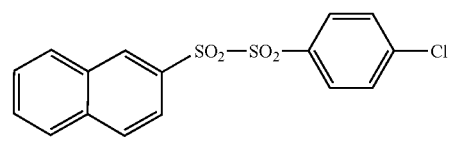 (PAG5-8)

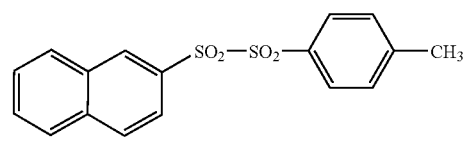 (PAG5-9)

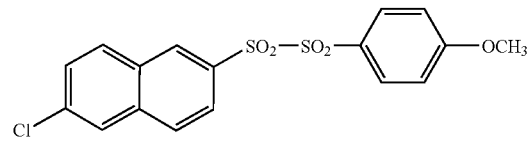 (PAG5-10)

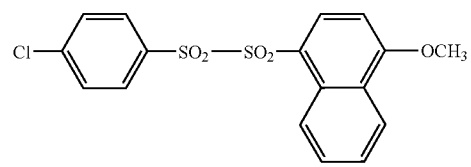 (PAG5-11)

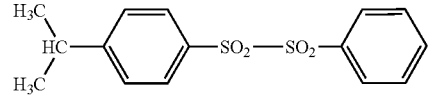 (PAG5-12)

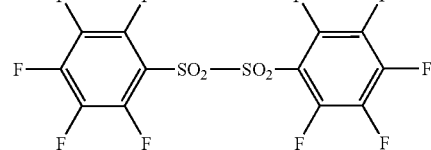 (PAG5-13)

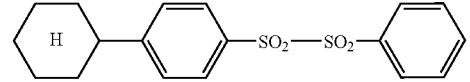 (PAG5-14)

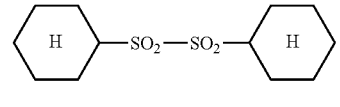 (PAG5-15)

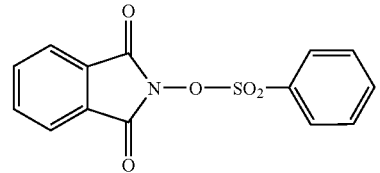 (PAG6-1)

-continued
(PAG6-2)
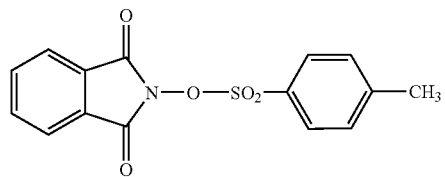
(PAG6-3)
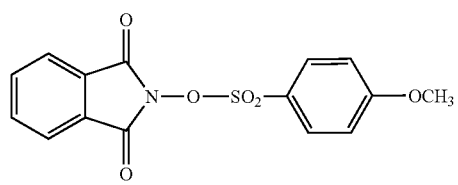
(PAG6-4)
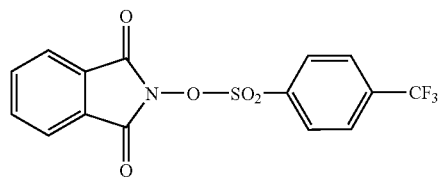
(PAG6-5)
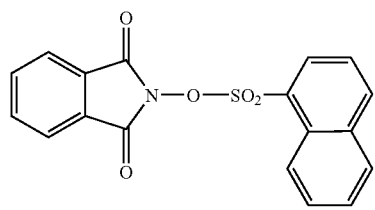
(PAG6-6)
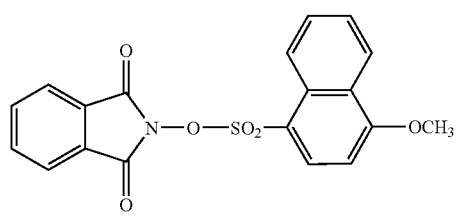
(PAG6-7)
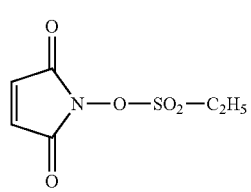
(PAG6-8)
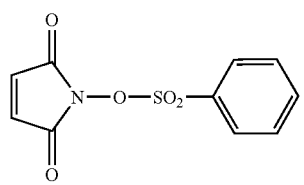
(PAG6-9)
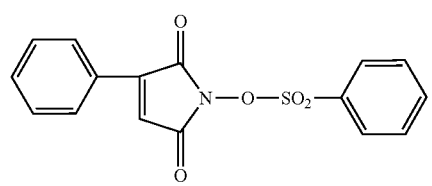
(PAG6-10)
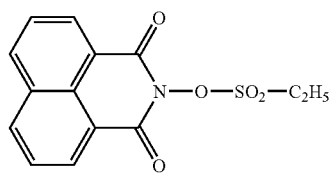
(PAG6-11)
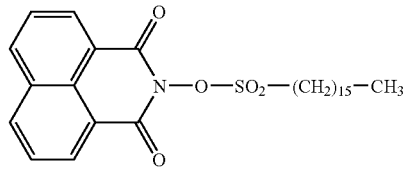
(PAG6-12)
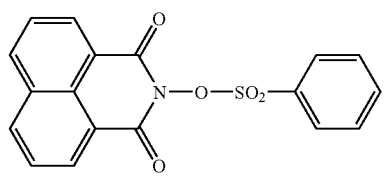
(PAG6-13)
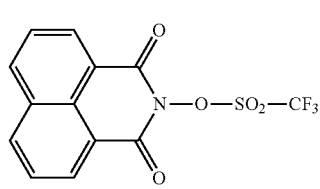
(PAG6-14)
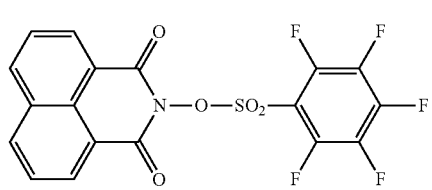
(PAG6-15)
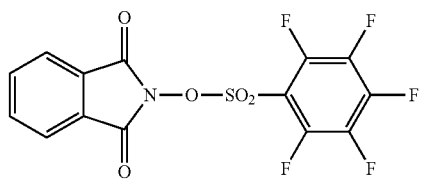
(PAG6-16)
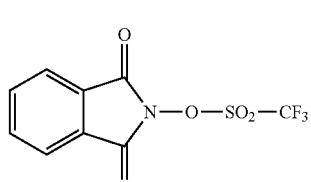
(PAG6-17)
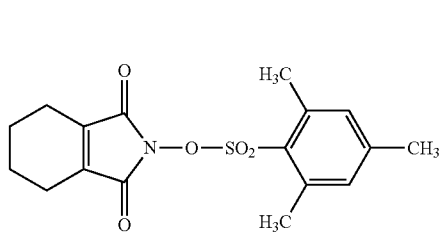

-continued

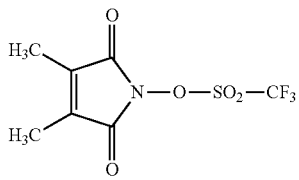
(PAG6-18)

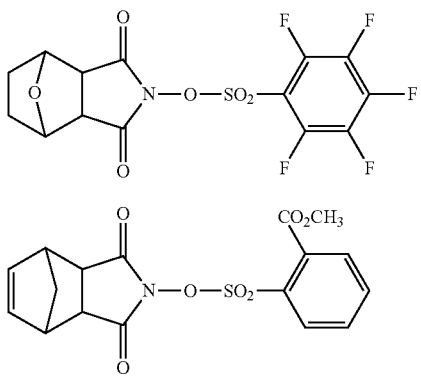
(PAG6-19)
(PAG6-20)

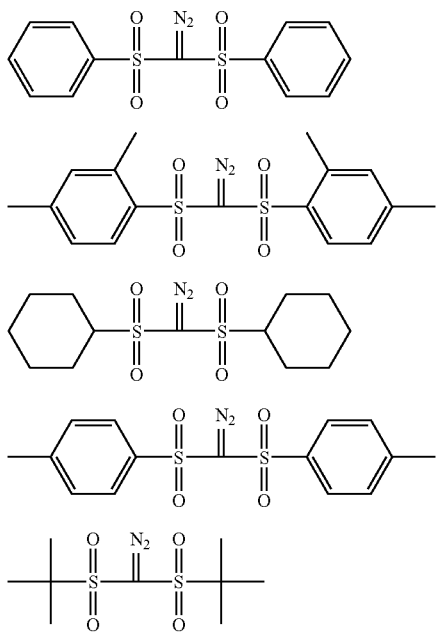
(PAG7-1)
(PAG7-2)
(PAG7-3)
(PAG7-4)
(PAG7-5)

The content of the compound of Component (B-1) for use in the invention is preferably from 1 to 30% by weight, more preferably from 2 to 25% by weight, and particularly preferably from 2 to 20% by weight, based on the total solid content of the positive resist composition.

Component (B-2): Compound that Generates a Carboxylic Acid Upon Irradiation of an Actinic Ray or Radiation It is preferred in the invention that the positive resist composition contains a compound that generates a carboxylic acid upon irradiation of an actinic ray or radiation (Compound (B-2)) in addition to the sulfonic acid generator of Compound (B-1).

The compound that generates a carboxylic acid is not particularly restricted, but compounds generating a carboxylic acid represented by formula (a) shown below are preferred.

Ra—COOH    (a)

Specific examples of the compound include sulfonium salts or iodonium salt of the carboxylic acid represented by formula (a) and ester compounds of N-hydroxyimide with the carboxylic acid represented by formula (a).

Of these compounds, compounds represented by formulae (c), (d) and (e) are preferred.

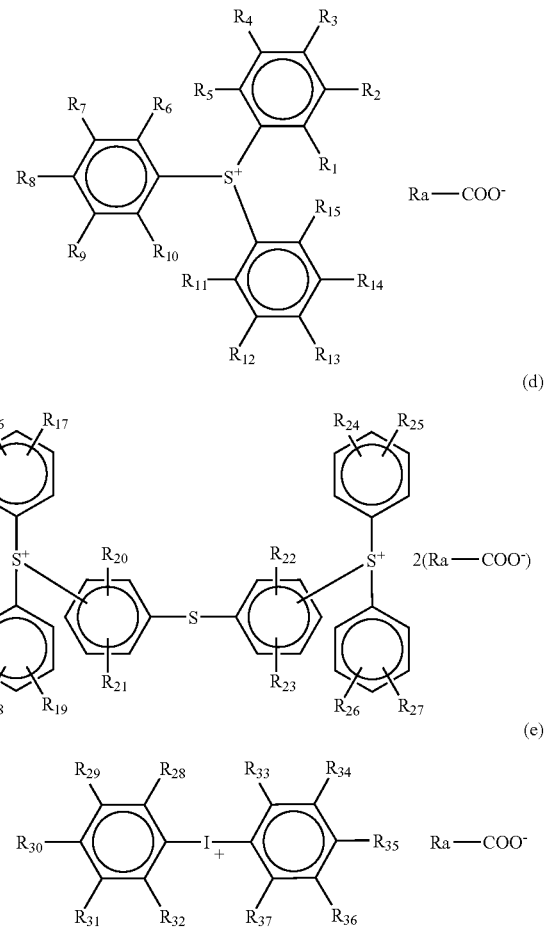

In formulae (c) to (e), $R_1$ to $R_{37}$ each independently represent a hydrogen atom, an alkyl group, an alkoxy group, a hydroxy group, a halogen atom or a group represented by —S—$R_{38}$ Ra represents an alkyl group or an aryl group.

The alkyl group represented by Ra may be a straight-chain or branched alkyl group and may have a substituent, and preferably includes a straight-chain or branched alkyl group having from 1 to 30 carbon atoms.

The aryl group represented by Ra may have a substituent, and preferably includes an aryl group having from 6 to 20 carbon atoms.

Examples of the substituent, which the alkyl group represented by Ra may have, include an aryl group (e.g., phenyl or naphthyl group), a cycloalkyl group (e.g., cyclohexyl or cycloheptyl group), a hydroxy group, an alkoxy group (e.g., methoxy, ethoxy, butoxy or octyloxy group), a halogen atom (e.g., iodine, bromine, chlorine or fluorine atom), an alkyl group substituted with a halogen atom, an alkylcarbonyl group (e.g., methylcarbonyl, ethylcarbonyl or butylcarbonyl group), an alkylcarbonyloxy group (e.g., methylcarbonyloxy, ethylcarbonyloxy or butylcarbonyloxy group), an alkyloxycarbonyl group (e.g., methoxycarbonyl, ethoxycarbonyl or butoxycarbonyl group), a cyano group, a nitro group, an N-alkylaminocarbonyl group, an N,N-dialkylaminocarbonyl group and an alkylcarbonylamino group.

Examples of the substituent, which the aryl group represented by Ra may have, include an alkyl group (e.g., methyl, ethyl, isopropyl, butyl, tert-butyl or octyl group) and those described as the above described substituents for the alkyl group.

Ra is more preferably a straight-chain or branched alkyl group having from 1 to 24 carbon atoms, which may have a substituent, a phenyl group, which may have a substituent, or a naphthyl group, which may have a substituent, and particularly preferably a straight-chain or branched alkyl group having from 1 to 18 carbon atoms, which may have a substituent and a phenyl group, which may have a substituent.

In particular, the alkyl group represented by Ra is preferably an alkyl group having from 1 to 4 carbon atoms or a perfluoroalkyl group having from 1 to 8 carbon atoms, more preferably an alkyl group having from 1 to 3 carbon atoms or a perfluoroalkyl group having from 1 to 6 carbon atoms, and particularly preferably a methyl group, an ethyl group, a trifluoromethyl group, a pentafluoroethyl group, a heptafluoropropyl group or a nonafluorobutyl group.

$R_1$ to $R_{38}$ in formulae (c) to (e) have the same meanings as $R_1$ to $R_{38}$ in formulae (I) to (III) described with respect to Component (B-1) respectively, and description of each of substituents is also same as the above.

Specific examples of the compounds represented by formulae (c) to (e) are set forth below, but the invention should not be construed as being limited thereto.

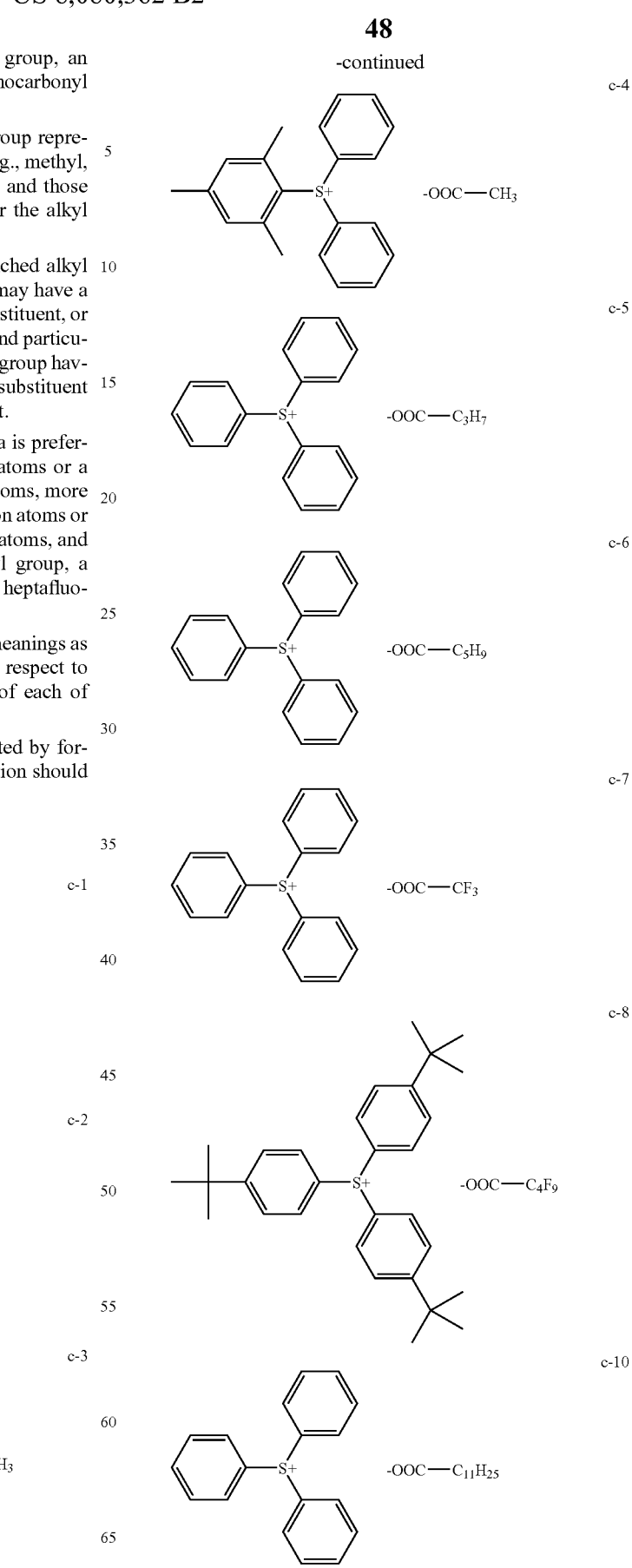

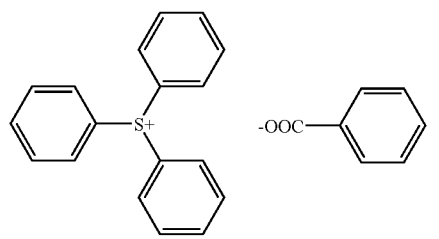 c-11
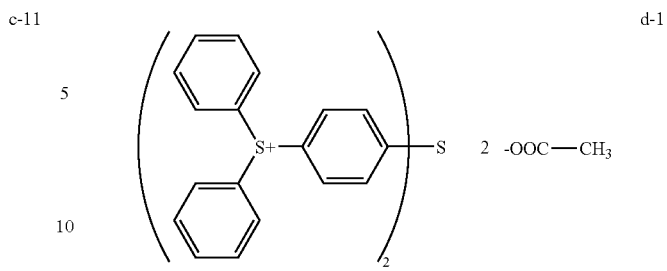 d-1
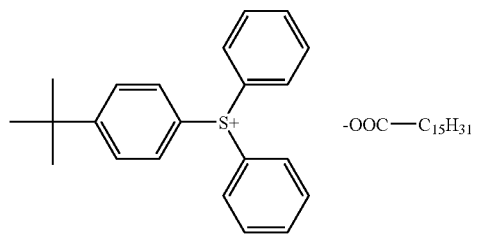 c-12
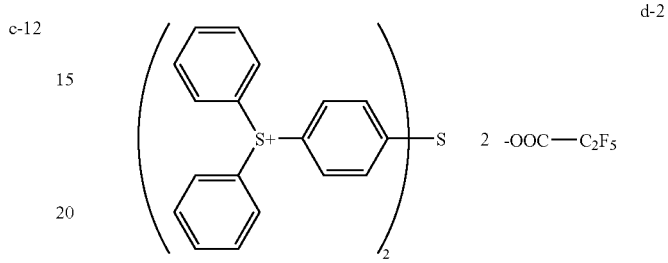 d-2
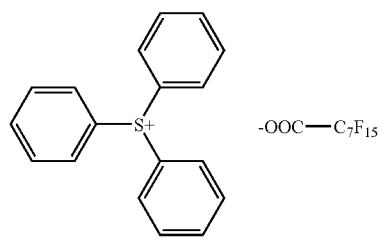 c-13
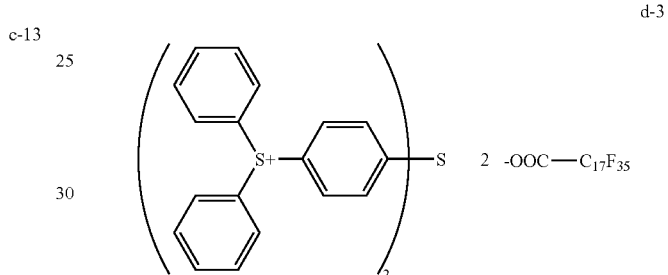 d-3
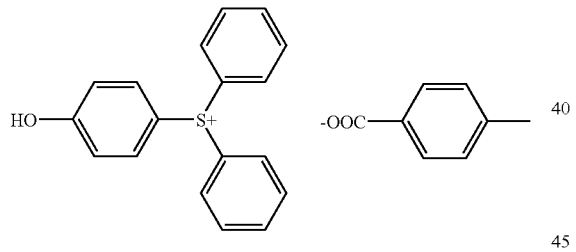 c-14
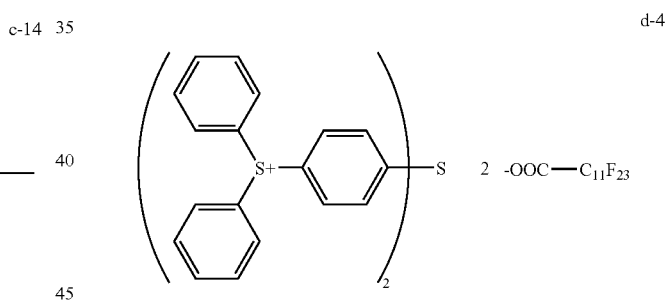 d-4
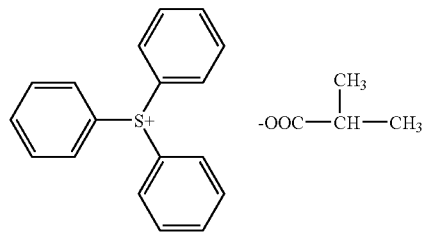 c-15
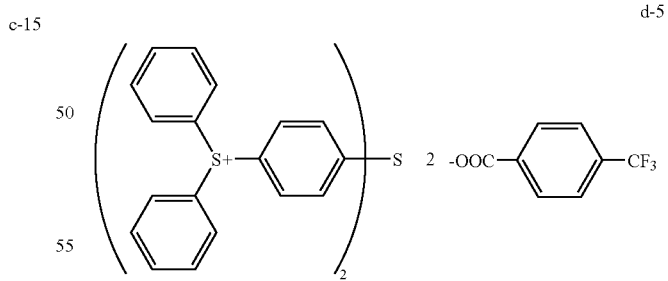 d-5
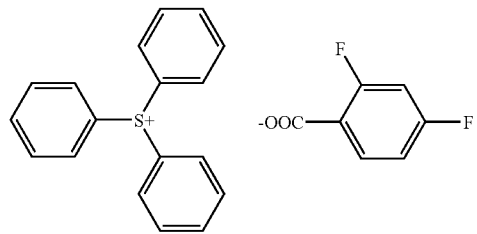 c-16
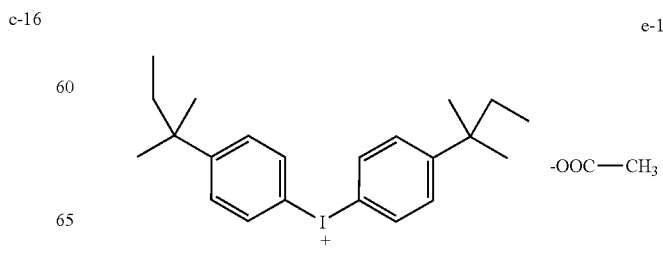 e-1

-continued

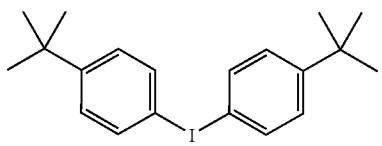
e-2

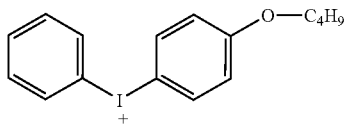
e-3

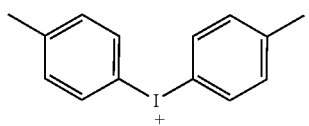
e-4

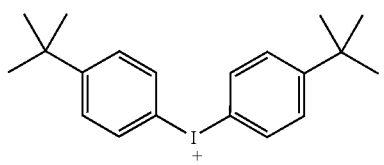
e-5

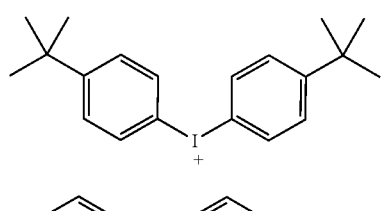
e-6

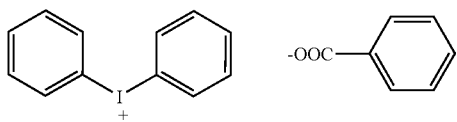
e-7

The content of the compound of Component (B-2) for use in the invention is preferably from 0.01 to 10% by weight, more preferably from 0.02 to 7% by weight, and particularly preferably from 0.03 to 5% by weight, based on the total solid content of the positive resist composition.

The total content of the compound of Component (B) for use in the invention is preferably from 1 to 40% by weight, more preferably from 2 to 30% by weight, and particularly preferably from 3 to 25% by weight, based on the total solid content of the positive resist composition.

[3] Component (C): Other Components for Use in the Positive Resist Composition of the Invention The positive resist composition of the invention may further contain other components, for example, a dye, a nitrogen-containing basic compound, a solvent, a surfactant or a radical generator, if desired.

(C)-1 Dye

A suitable dye includes an oil dye and a basic dye. Specific examples of the dye include Oil Yellow #101, Oil Yellow #103, Oil Pink #312, Oil Green BG, Oil Blue BOS, Oil Blue #603, Oil Black BY, Oil Black BS, Oil Black T-505 (these dyes are manufactured by Orient Chemical Industries, Ltd.), Crystal Violet (CI 42555), Methyl Violet (CI 42535), Rhodamine B (CI 45170B), Malachite Green (CI 42000) and Methylene Blue (CI 52015).

(C)-2 Nitrogen-Containing Basic Compound

The nitrogen-containing basic compound for use in the present invention is preferably a nitrogen-containing basic compound having the basicity stronger than that of phenol. Preferred nitrogen-containing basic compound includes, for example, a quaternary ammonium salt compound and the compound represented by formula (b) shown below is preferred.

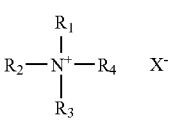
(b)

In the above formula, $R_1$ to $R_4$ each independently represent a hydrogen atom or an alkyl group (preferably having from 1 to 22 carbon atoms).

The alkyl group represented by any one of $R_1$, to $R_4$ may have a substituent. Examples of the substituent include a hydroxy group, an alkoxy group having from 1 to 4 carbon atoms or a phenyl group. Alternatively, two or more of $R_1$ to $R_4$ may be combined with each other to form a ring.

$R_1$ to $R_4$ each independently represent preferably a hydrogen atom or an alkyl group having from 1 to 18 carbon atoms and particularly preferably an alkyl group having from 1 to 12 carbon atoms (for example, methyl, ethyl, propyl, isopropyl, butyl, tert-butyl, hexyl, octyl, decyl or dodecyl group).

X represents an OH group, a halogen atom (for example, fluorine, chlorine, bromine or iodine atom), an Rb—COOH group or a Rb—SO$_3$H group. Rb represents a hydrogen atom, an alkyl group or an aryl group.

The alkyl group represented by Rb is preferably an alkyl group having from 1 to 11 carbon atoms, which may have a substituent. The aryl group represented by Rb is preferably an aryl group having from 6 to 12 carbon atoms, which may have a substituent. Examples of the substituent for the alkyl group include a phenyl group, a hydroxy group, an alkoxy group having from 1 to 4 carbon atoms a halogen atom (for example, fluorine, chlorine, bromine or iodine atom) and an amino group. Examples of the substituent for the aryl group include an alkyl group having from 1 to 4 carbon atoms, a hydroxy group, an alkoxy group having from 1 to 4 carbon atoms, a halogen atom (for example, fluorine, chlorine, bromine or iodine atom), an amino group, a nitro group and a cyano group.

X is preferably an OH group, a chlorine atom, a bromine atom, an alkylcarboxylic acid group having from 1 to 8 carbon atoms in the alkyl moiety thereof (for example, a CH$_3$—COOH group, a C$_2$H$_5$—COOH group, a C$_4$H$_9$—COOH group or a C$_8$H$_{17}$—COOH group), and particularly preferably an OH group, a chlorine atom, a bromine atom, an alkylcarboxylic acid group having from 1 to 4 carbon atoms in the alkyl moiety thereof.

Specific examples of the quaternary ammonium salt compound are set forth below, but the invention should not be construed as being limited thereto.

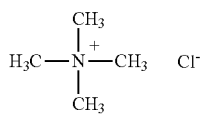
D-1

-continued

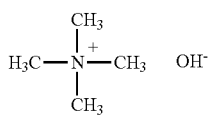

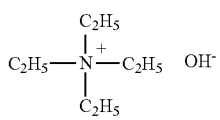

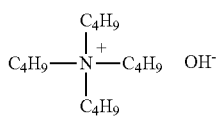

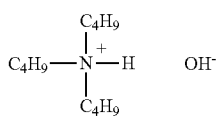

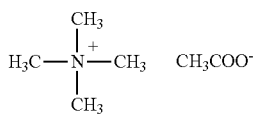

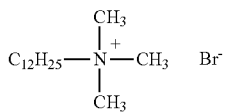

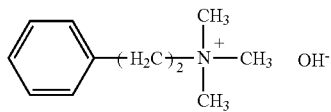

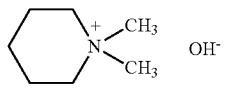

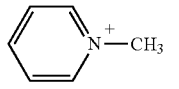

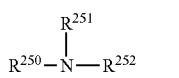

Preferred examples of the nitrogen-containing basic compound other than the quaternary ammonium salt compound include compounds having a structure represented by the following formula (A), (B), (C), (D) or (E):

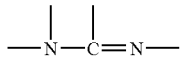 (A)

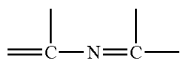 (B)

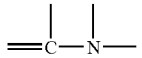 (C)

(D)

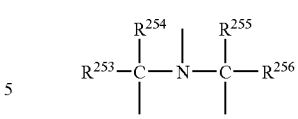 (E)

wherein $R^{250}$, $R^{251}$ and $R^{252}$, which may be the same or different, each represent a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, or $R^{251}$ and $R^{252}$ may combine with each other to form a ring.

$R^{253}$, $R^{254}$, $R^{255}$ and $R^{256}$, which may be the same or different, each represent an alkyl group having from 1 to 6 carbon atoms.

More preferable compounds are nitrogen-containing basic compounds having at least two nitrogen atoms of different chemical environments in one molecule. A compound containing both a substituted or unsubstituted amino group and a ring structure containing a nitrogen atom, and a compound containing an alkylamino group are particularly preferred.

Preferred specific examples include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted imidazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Particularly preferable compounds include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminbethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2, 4-diaminopyrimidine, 4,6-dihydroxypyrimidine, 2-pyrazoline, 3-pyrazoline, N-aminomorpholine and N-(2-aminoethyl)morpholine. However, the invention should not be construed as being limited to these compounds.

The nitrogen-containing basic compounds may be used individually or as a mixture of two or more thereof.

With respect to a ratio of the acid generator of component (B) and the nitrogen-containing basic compound in the positive resist composition, a molar ratio of (acid generator)/ (nitrogen-containing basic compound) is preferably from 2.5 to 300. When the molar ratio is less than 2.5, the sensitivity decreases and the resolving power is sometimes lowered. On the other hand, when the molar ratio exceeds 300, the resist pattern size increases with the passage of time from light exposure to heat treatment, and the resolving power is also sometimes lowered. The molar ratio of (acid generator)/(nitrogen-containing basic compound) is preferably from 5.0 to 200, and more preferably from 7.0 to 150.

(C)-3 Solvent

The positive resist composition of the invention is dissolved in a solvent capable of dissolving the components described above and coated on a support. Preferred examples of the solvent used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone and tetrahydrofuran. The solvents are used individually or as a mixture of two or more thereof.

(C)-4 Surfactant

It is preferred that the positive resist composition of the invention further contains one or more of fluorine-base and/or silicon-base surfactants (a fluorine atom-containing surfactant, a silicon atom-containing surfactant and a surfactant containing both a fluorine atom and a silicon atom).

By the incorporation of the fluorine-base and/or silicon-base surfactant, the positive resist composition of the invention can provide, with preferable sensitivity and resolution, resist patterns having good adhesion and less development defect, when an exposure light source of 250 nm or shorter, especially 220 nm or shorter is used.

Examples of the surfactant include those described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. Commercially available surfactants as described below can also be used as they are.

Examples of the commercially available surfactant used include fluorine-base or silicon-base surfactants, for example, Eftop EF301 and EF303 (manufactured by Shin-Akita Kasei Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, SC102, SC103, SC104, SC105 and SC106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as a silicon-base surfactant.

Besides the above described known surfactants, a surfactant comprising a polymer including a fluoroaliphatic group derived from a fluoroaliphatic compound produced by a telomerization method (also referred to as a telomer method) or an oligomerization method (also referred to as an oligomer method) can be used as the surfactant. The fluoroaliphatic compound can be synthesized according to methods described in JP-A-2002-90991.

As the polymer including a fluoroaliphatic group, a copolymer of a monomer having a fluoroaliphatic group with (poly(oxyalkylene)) acrylate and/or (poly(oxyalkylene)) methacrylate is preferred. The copolymer may be a random copolymer or a block copolymer. The poly(oxyalkylene) group includes, for example, a poly(oxyethylene) group, a poly(oxypropylene) group and a poly(oxybutylene) group.

Also, a unit containing alkylenes having different chain lengths in the chain thereof, for example, poly(oxyethylene-oxypropylene-oxyethylene block connecting) group or poly (oxyethylene-oxypropylene block connecting) group may be used. Further, the copolymer of a monomer having a fluoroaliphatic group with a (poly(oxyalkylene)) acrylate (or methacrylate) may be not only a binary copolymer but also a ternary or more copolymer obtained by copolymerizing simultaneously two or more different monomers having a fluoroaliphatic group with two or more different (poly(oxyalkylene)) acrylates (or methacrylates).

Examples of the polymer including a fluoroaliphatic group include commercially available surfactants, for example, Megafac F178, F-470, F-473, F-475, F-476 and F-472 (manufactured by Dainippon Ink and Chemicals, Inc.). Also, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (or methacrylate) and (poly(oxypropylene)) acrylate (or methacrylate), copolymers of acrylate (or methacrylate) having a $C_8F_{17}$ group and (poly(oxyalkylene)) acrylate (or methacrylate), copolymers of acrylate (or methacrylate) having a $C_8F_{17}$ group, (poly(oxyethylene)) acrylate (or methacrylate) and (poly(oxypropylene)) acrylate (or methacrylate are exemplified.

The amount of the surfactant used is preferably from 0.0001 to 2% by weight, and more preferably from 0.001 to 1% by weight based on the total amount of the positive resist composition (excluding the solvent).

The pattern formation process on a resist film in the production of precise integrated circuit device comprises coating the positive resist composition of the invention to a substrate (for example, a silicon/silicon dioxide coating substrate, a glass substrate, an ITO substrate or a quartz/chromium oxide coating substrate) to prepare a resist film and irradiating the resist film with an actinic ray or radiation, followed by heating, developing, rinsing and drying, whereby a good resist pattern is formed. As the actinic ray or radiation, for example, an electron beam, an X-ray, an EUV beam or an excimer laser beam having a wavelength of from 150 to 250 nm can be employed. An electron beam, an X-ray or an EUV beam is preferred.

In the invention, a known inorganic or organic anti-reflective coating may be used, if desired. Further, the anti-reflective coating may be coated on the resist layer.

Suitable examples of the anti-reflective coating used for an under layer of the resist layer include an inorganic coating type, for example, titanium, titanium dioxide, titanium nitride, chromium oxide, carbon or amorphous silicon, and an organic coating type comprising a light absorbent and a polymer material. The former requires an apparatus, for example, a vacuum deposition apparatus, a CVD apparatus or a sputtering apparatus, for the formation of anti-reflective coating. The organic anti-reflective coating includes, for example, a coating comprising a condensate of a diphenylamine derivative with a formaldehyde-modified melamine resin, an alkali-soluble resin and a light absorbent as described in JP-B-7-69611, a coating comprising a reaction product of a maleic anhydride copolymer with a diamine light absorbent as described in U.S. Pat. No. 5,294,680, a coating comprising a resin binder and a methylolmelamine thermal crosslinking agent as described in JP-A-6-118631, a coating comprising an acrylic resin containing a carboxylic acid group, an epoxy group and a light absorbing group in the same molecule as described in JP-A-6-118656, a coating comprising methylolmelamine and a benzophenone light absorbent as described in JP-A-8-87115, and a coating comprising a low molecular weight light absorbent added to a polyvinyl alcohol resin as described in JP-A-8-179509.

Also, a commercially available organic anti-reflective coating, for example, DUV-30 Series and DUV-40 Series (manufactured by Brewer Science, Inc.) and AR-2, AR-3 and AR-5 (manufactured by Shipley Co., Ltd.) are employed as the organic anti-reflective coating.

A developing solution for the positive resist composition of the invention is ordinarily an aqueous solution of an alkali (ordinarily containing from 0.1 to 10% by weight of the alkali and having pH of from 10 to 15). The alkali includes, for example, an inorganic alkali, e.g., sodium hydroxide, potassium hydroxide, sodium carbonate, sodium silicate, sodium metasilicate or aqueous ammonia; a primary amine, e.g., ethylamine or n-propylamine; a secondary amine, e.g., diethylamine or di-n-butylamine; a tertiary amine, e.g., triethylamine or methyldiethylamine; an alcoholamine, e.g., dimethylethanolamine or triethanolamine; a quaternary ammonium salt, e.g., tetramethylammonium hydroxide, tetraethylammonium hydroxide or choline; and a cyclic amine, e.g., pyrrole or piperidine. Further, the aqueous solution of alkali containing an appropriate amount of an alcohol, e.g., isopropyl alcohol or a surfactant, e.g., a nonionic surfactant may be used.

Of the developing solutions, a developing solution containing a quaternary ammonium salt is preferred, and a developing solution containing tetramethylammonium hydroxide or choline is more preferred.

The present invention will be described in more detail with reference to the following examples, but the invention should not be construed as being limited thereto.

1. SYNTHESIS EXAMPLE OF RESIN

Synthesis Example 1

Synthesis of Polymer (B-28)

In 80 ml of tetrahydrofuran were dissolved 20 g of poly(p-hydroxystyrene) (VP-2500 manufactured by Nippon Soda Co., Ltd.) and 6.5 g of benzylethyl vinyl ether. To the solution was added 0.01 g of p-toluenesulfonic acid, followed by reacting at room temperature for 18 hours. The reaction solution was added dropwise into 5 liters of distilled water with vigorous stirring and the powder thus deposited was collected by filtration, washed with water and dried to obtain Polymer (B-28).

Synthesis Example 2

Synthesis of Polymer (B-32)

In 300 ml of toluene was dissolved 83.1 g (0.5 mol) of p-cyclohexylphenol, and to the solution were added 150 g of 2-chloroethyl vinyl ether, 25 g of sodium hydroxide, 5 g of tetrabutylammonium bromide and 60 g of triethylamine, followed by reacting at 120° C. for 5 hours. The reaction solution was washed with water, and the excess 2-chloroethyl vinyl ether and toluene were distilled off. The oil thus obtained was purified by distillation under a reduced pressure to obtain 4-cyclohexylphenoxyethyl vinyl ether.

In 80 ml of tetrahydrofuran were dissolved 20 g of poly(p-hydroxystyrene) (VP-2500 manufactured by Nippon Soda Co., Ltd.) and 6.5 g of 4-cyclohexylphenoxyethyl vinyl ether. To the solution was added 0.01 g of p-toluenesulfonic acid, followed by reacting at room temperature for 18 hours. The reaction solution was added dropwise to 5 liters of distilled water with vigorous stirring and the powder thus deposited was collected by filtration and dried to obtain Polymer (B-32).

Other polymers were synthesized in a similar manner. With the polymers for use in the examples described below, the weight average molecular weight, dispersion of molecular weight (Mw/Mn) and the molar ratio of repeating unit are described below.

| Polymer | Weight Average Molecular Weight | Dispersion of Molecular Weight | Molar Ratio of Repeating unit[*] |
|---------|-------------------------------|-------------------------------|----------------------------------|
| B-28    | 2,500                         | 1.20                          | 70/30                            |
| B-29    | 3,000                         | 1.40                          | 73/27                            |
| B-30    | 5,000                         | 1.25                          | 77/23                            |
| B-31    | 2,500                         | 1.20                          | 65/10/25                         |
| B-32    | 2,500                         | 1.40                          | 76/24                            |

[*]The molar ratio of repeating unit is indicated using the repeating units of the polymers described in the specific examples of the polymer of Component (A) hereinbefore and in each polymer the numeral means the molar ratio of the repeating unit in order from left to right.

Comparative Synthesis Example

Synthesis of Polymer (B-21)

In 120 ml of butyl acetate were dissolved 32.4 g (0.2 mol) of p-acetoxystyrene and 7.01 g (0.07 mol) of tert-butyl methacrylate. To the solution were added three times each 0.033 g of azobisisobutyronitrile (AIBN) at an interval of 2.5 hours at 80° C. with stirring in a nitrogen gas stream and then the mixture was further stirred for 5 hours, whereby the polymerization reaction was conducted. The resulting reaction solution was poured into 1,200 ml of hexane to precipitate a white resin. The resin obtained was dried and then dissolved in 200 ml of methanol.

To the solution was added an aqueous solution prepared by dissolving 7.7 g (0.19 mol) of sodium hydroxide in 50 ml of water, and the mixture was refluxed by heating for one hour to hydrolyze the resin. Then, the reaction mixture was diluted by adding 200 ml of water and neutralized with hydrochloric acid to deposit a white resin. The resin was collected by filtration, washed with water, dried and then dissolved in 200 ml of tetrahydrofuran to prepare a solution. The solution was added dropwise to 5 liters of ultrapure water with vigorous stirring to reprecipitate. The reprecipitation operation was repeated three times. The resin thus obtained was dried in a vacuum dryer at 120° C. for 12 hours to obtain copoly(p-hydroxystyrene/tert-butyl methacrylate) (B-21).

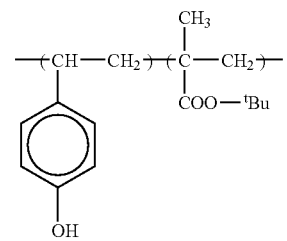

(B-21)

| Polymer | Weight Average Molecular Weight | Dispersion of Molecular Weight | Molar Ratio of Repeating unit[*] |
|---------|-------------------------------|-------------------------------|----------------------------------|
| B-21    | 2,500                         | 1.20                          | 65/35                            |

[*]The molar ratio of repeating unit is indicated using the repeating units of the polymer described above and the numeral means the molar ratio of the repeating unit in order from left to right.

2. SYNTHESIS EXAMPLE OF COMPONENT (B)

(4-1) Synthesis of Triphenylsulfonium Acetate (c-1)

In 800 ml of benzene was dissolved 50 g of diphenyl sulfoxide, and after the addition of 200 g of aluminum chloride, the mixture was refluxed for 24 hours. The reaction solution was gradually poured into 2 liters of ice water, and after the addition of 400 ml of concentrated hydrochloric acid, the mixture was heated at 70° C. for 10 minutes. The aqueous solution was washed with 500 ml of ethyl acetate, and after filtration, a solution containing 200 g of ammonium iodide dissolved in 400 ml of water was added thereto. The powder thus precipitated was collected by filtration, washed with water and then with ethyl acetate, and dried to obtain 70 g of triphenylsulfonium iodide.

In 1,000 ml of methanol was dissolved 30.5 g of triphenylsulfonium iodide, and after the addition of 19.1 g of silver oxide to the resulting solution, the mixture was stirred at room temperature for 4 hours. The reaction solution was filtered and to the filtrate was added an excessive amount of a solution of commercially available tetraammonium acetate. The reaction solution was concentrated, the resulting residue was dissolved in 500 ml of dichloromethane, and the solution was washed with a 5% aqueous solution of tetramethylammonium hydroxide and then with water. The organic layer was dried over anhydrous sodium sulfate, and then concentrated to obtain triphenylsulfonium acetate (c-1).

(4-2) Synthesis of Di(4-tert-amylphenyl)iodonium Acetate (e-1)

To a mixture of 60 g of tert-amylbenzene, 39.5 g of potassium iodate, 81 g of acetic anhydride and 170 ml of dichloromethane was gradually added dropwise 66.8 g of concentrated sulfuric acid under cooling with ice. After stirring under cooling with ice for 2 hours, the mixture was further stirred at room temperature for 10 hours. To the reaction solution was added 500 ml of water under cooling with ice, and the resulting mixture was extracted with dichloromethane. The organic layer was washed with an aqueous solution of sodium hydrogen carbonate and then with water, and concentrated to obtain di(4-tert-amylphenyl)iodonium sulfate. The resulting sulfate was added to an excessive amount of a solution of commercially available tetraammonium acetate. To the solution was added 500 ml of water, and the solution was extracted with dichloromethane. The organic layer was washed with a 5% aqueous solution of tetramethylammonium hydroxide and then with water. The organic layer was dried over anhydrous sodium sulfate and concentrated to obtain di(4-tert-amylphenyl)iodonium acetate (e-1).

Other compounds were synthesized in a similar manner.

EXAMPLE 1

(1) Preparation and Coating of Positive Resist

| | |
|---|---|
| Component (A): Acid Decomposable Polymer (B-28) | 0.94 g |
| Component (B): Sulfonic Acid Generator I-1 | 0.05 g |
| Component (C): Carboxylic Acid Generator c-1 | 0.003 g |
| Nitrogen-Containing Basic Compound: 2,4,5-Triphenylimidazole (OE-3) | 0.002 g |

The above components were dissolved in 8.5 g of propylene glycol monomethyl ether acetate and to the solution was added 0.001 g of Megafac F176 (manufactured by Dainippon Ink & Chemicals, Inc., hereinafter abbreviated as W-1) to dissolve. The solution thus-obtained was subjected to microfiltration using a membrane filter having a pore size of 0.1 μm to prepare a resist solution.

The resist solution was coated on a 6-inch silicon wafer using a spin coater (Mark 8 manufactured by Tokyo Electron Ltd.) and baked at 110° C. for 90 seconds to prepare a uniform film having a thickness of 0.30 μm.

EXAMPLES 2 TO 13

Each resist solution was prepared in the same manner as in Example 1 except for using each component as shown in Table 1 below. Using the resist solution, a resist film was prepared in the same manner as in Example 1.

COMPARATIVE EXAMPLE 1

A resist solution was prepared in the same manner as in Example 1 except for using Resin B"-28, which had the same monomer structure as Polymer (B-28) but a weight average molecular weight of 15,000, in place of the resin of Component (A) of the invention. Using the resist solution, a resist film was prepared in the same manner as in Example 1.

COMPARATIVE EXAMPLE 2

A resist solution was prepared in the same manner as in Example 1 except for using Resin B'-28, which had the same monomer structure as Polymer (B-28) but a weight average molecular weight of 8,000, in place of the resin of Component (A) of the invention. Using the resist solution, a resist film was prepared in the same manner as in Example 1.

COMPARATIVE EXAMPLE 3

A resist solution was prepared in the same manner as in Example 1 except for using <B-1>, which was Resin B-1 described in JP-A-11-305443, in place of the resin of Component (A) of the invention. Using the resist solution, a resist film was prepared in the same manner as in Example 1.

TABLE 1

| | Component A (0.94 g) | Component B (0.05 g) | Component C (0.003 g) | Nitrogen-Containing Basic Compound (0.002 g) | Surfactant (0.001 g) |
|---|---|---|---|---|---|
| Example 1 | B-28 | (I-1) | c-1 | OE-3 | W-1 |
| Example 2 | B-29 | PAG4-4 | c-3 | OE-4 | W-1 |
| Example 3 | B-30 | PAG4-36 | c-5 | OE-3 | W-1 |
| Example 4 | B-31 | PAG4-4 | — | — | W-1 |
| Example 5 | B-32 | PAG4-33 | c-1 | OE-4 | W-2 |
| Example 6 | B-28 | (I-1) | c-7 | OE-1 | W-1 |
| Example 7 | B-30 | (I-1) | c-8 | OE-2 | W-1 |
| Example 8 | B-32 | PAG4-4 | c-1 | OE-3 | W-1 |
| Example 9 | B-29 | PAG4-36 | — | — | W-1 |

TABLE 1-continued

|  | Component A (0.94 g) | Component B (0.05 g) | Component C (0.003 g) | Nitrogen-Containing Basic Compound (0.002 g) | Surfactant (0.001 g) |
|---|---|---|---|---|---|
| Example 10 | B-30 | PAG4-4 | c-1 | DD-1 | W-1 |
| Example 11 | B-31 | (I-1) | d-1 | OE-4 | W-1 |
| Example 12 | B-32 | (I-1) | — | DD-1 | W-1 |
| Example 13 | B-30 | PAG4-4 | c-2 | OE-2 | — |
| Comparative Example 1 | B''-28 | PAG4-36 | c-1 | OE-3 | W-1 |
| Comparative Example 2 | B'-28 | (I-1) | — | OE-4 | W-1 |
| Comparative Example 3 | <B-1> | (I-1) | — | OE-4 | W-1 |

The abbreviations of components used in Table 1 are explained below.
OE-1: 4-Dimethylaminopyridine
OE-2: Benzimidazole
OE-3: 2,4,5-Triphenylimidazole
OE-4: 1,4-Diazabicyclo[5.4.0]undecene
W-2: Siloxane Polymer KP 341 (manufactured by Shin-Etsu Chemical Industry Co., Ltd.)
DD-1: Tetramethylammonium hydroxide (manufactured by Tokyo Kasei Kogyo Co., Ltd.)

(2) Preparation of Positive Resist Pattern and Evaluation thereof

The resist film was subjected to electron beam irradiation using an electron beam drawing device (HL 750 manufactured by Hitachi, Ltd.; acceleration voltage: 50 KeV). After the irradiation, the resist film was baked at 110° C. for 90 seconds, immersed in a 2.38% by weight aqueous solution of tetramethylammonium hydroxide (TMAH) for 60 seconds to develop, rinsed with water for 30 seconds and dried. The pattern thus obtained was evaluated in the following manner.
(2-1) Sensitivity A cross-sectional shape of the pattern was observed using a scanning electron microscope (S-4300 manufactured by Hitachi, Ltd.). The minimum irradiation energy necessary for resolving a contact hole pattern of 0.15 μm (duty ratio=1:2) was designated as the sensitivity.
(2-2) Resolution The resolution was expressed using a limiting resolution (contact hole pattern being separately resolved) in the irradiation amount sufficient for obtaining the above sensitivity.
(2-3) Pattern Profile A cross-sectional shape of the contact hole pattern of 0.15 μm in the irradiation amount sufficient for obtaining the above sensitivity was observed using a scanning electron microscope (S-4300 manufactured by Hitachi, Ltd.) and classified into three levels: rectangle, slight taper and taper, for the evaluation.
(2-4) in vacuo PEB Property A wafer was set in a vacuum chamber, irradiated with an electron beam in the irradiation amount sufficient for obtaining the above sensitivity, immediately or 3 hour later baked at 110° C. for 90 seconds (heat treatment) and subjected to development processing as described above to obtain a contact hole pattern.

With the contact hole pattern of 0.15 μm obtained by the baking immediately after the irradiation of an electron beam and development processing and the contact hole pattern of 0.15 μm obtained by the baking 3 hour after the irradiation of an electron beam and development processing, a line width was measured by a scanning electron microscope (S-9220 manufactured by Hitachi, Ltd.), and the difference of the line width between both contact hole patterns was designated as the in vacuo PEB property.

TABLE 2

|  | Sensitivity ($\mu C/cm^2$) | Resolution (μm) | Pattern Profile (three-level evaluation) | in vacuo PEB Property (nm) |
|---|---|---|---|---|
| Example 1 | 5.0 | 0.09 | rectangle | 2.0 |
| Example 2 | 4.5 | 0.10 | rectangle | 1.9 |
| Example 3 | 5.5 | 0.09 | rectangle | 1.6 |
| Example 4 | 5.0 | 0.09 | rectangle | 2.5 |
| Example 5 | 5.5 | 0.07 | rectangle | 1.5 |
| Example 6 | 4.0 | 0.08 | slight taper | 2.0 |
| Example 7 | 4.5 | 0.09 | rectangle | 2.2 |
| Example 8 | 4.0 | 0.07 | rectangle | 1.9 |
| Example 9 | 4.5 | 0.11 | rectangle | 2.0 |
| Example 10 | 5.0 | 0.12 | rectangle | 1.8 |
| Example 11 | 5.0 | 0.10 | slight taper | 2.0 |
| Example 12 | 4.5 | 0.08 | rectangle | 2.3 |
| Example 13 | 4.5 | 0.09 | rectangle | 2.1 |
| Comparative Example 1 | 6.0 | 0.14 | slight taper | 2.5 |
| Comparative Example 2 | 6.5 | 0.13 | taper | 2.6 |
| Comparative Example 3 | 6.0 | 0.12 | rectangle | 2.4 |

As is apparent from the results shown in Table 2, the positive resist compositions of the invention using a resin having the specific structure and the specific molecular weight and protective ratio exhibit the high resolution, high sensitivity, good pattern profile and excellent in vacuo PEB property with the irradiation of radiation in comparison with the compositions of comparative examples.

According to the present invention, a positive resist composition, which simultaneously satisfies high sensitivity, high resolution, good pattern profile and excellent in vacuo PEB property with respect to pattern formation by the irradiation of an actinic ray or radiation, can be provided.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A positive resist composition consisting essentially of:
(a) a resin that is decomposed by the action of an acid to increase solubility in an alkali developing solution, contains a structural unit having a group represented by formula (X) shown below, has a weight average molecular weight of not more than 5,000, and contains an acid decomposable group in an amount of not more than 40% based on the sum total of the number of acid decomposable groups and the number of alkali-soluble groups not protected with the acid decomposable group,

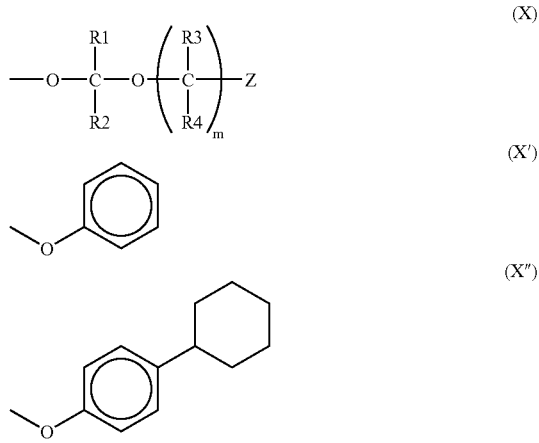

in formula (X), R1 and R2, which may be the same or different, each represents a hydrogen atom or an alkyl group having from 1 to 4 carbon atoms; R3 and R4, which may be the same or different, each represents a hydrogen atom or an alkyl group; Z represents a group represented by formula (X') or formula (X"); and m represents an integer of from 1 to 20;
(b) a compound that generates an acid upon irradiation with an actinic ray or radiation;
(c) a nitrogen-containing basic compound;
(d) a solvent; and
(e) a surfactant;
wherein the resin comprises a structural unit (B-29) or a structural unit (B-32) shown below:

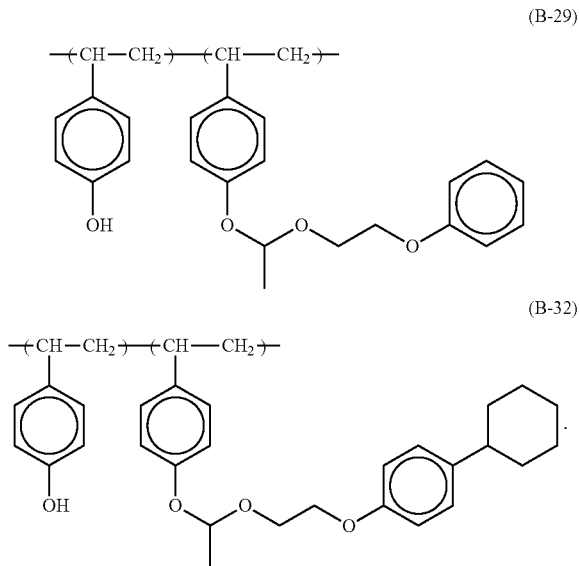

2. The positive resist composition according to claim 1, wherein the nitrogen-containing basic compound is a quaternary ammonium salt compound.

3. The positive resist composition according to claim 1, wherein the resin has a molecular weight distribution (Mw/Mn) of from 1.0 to 1.6.

4. A pattern formation process comprising coating a positive resist composition to a substrate to prepare a resist film and irradiating the resist film with an actinic ray or radiation, followed by heating, developing, rinsing and drying, whereby a good resist pattern is formed,
wherein the positive resist composition is a positive resist composition of claim 1.

5. The pattern formation process according to claim 4, wherein an electron beam, an X-ray or an EUV beam is employed as the actinic ray or radiation.

6. A positive resist composition consisting essentially of:
(a) a resin that is decomposed by the action of an acid to increase solubility in an alkali developing solution, contains a structural unit having a group represented by formula (X) shown below, has a weight average molecular weight of not more than 5,000, and contains an acid decomposable group in an amount of not more than 40% based on the sum total of the number of acid decomposable groups and the number of alkali-soluble groups not protected with the acid decomposable group,

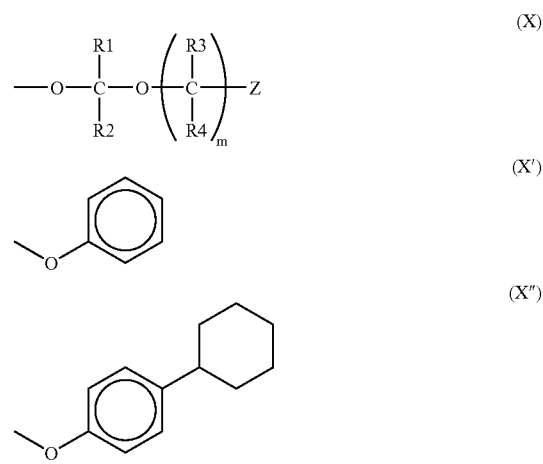

in formula (X), R1 and R2, which may be the same or different, each represents a hydrogen atom or an alkyl group having from 1 to 4 carbon atoms; R3 and R4, which may be the same or different, each represents a hydrogen atom or an alkyl group; Z represents a group represented by formula (X') or formula (X"); and m represents an integer of from 1 to 20;
(b) a compound that generates a sulfonic acid upon irradiation with an actinic ray or radiation;
(c) a compound that generates a carboxylic acid upon irradiation with an actinic ray or radiation;
(d) a nitrogen-containing basic compound;
(e) a solvent; and
(f) a surfactant;
wherein the resin comprises a structural unit (B-29) or a structural unit (B-32) shown below:

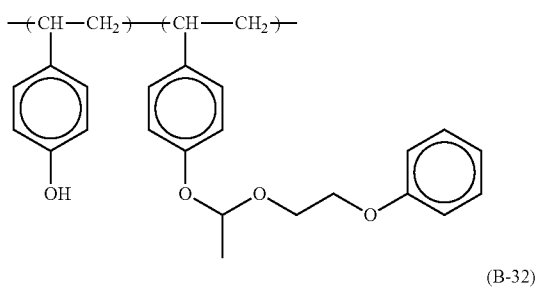

(B-29)

(B-32)

7. The positive resist composition according to claim 6, wherein the nitrogen-containing basic compound is a quaternary ammonium salt compound.

8. The positive resist composition according to claim 6, wherein the resin has a molecular weight distribution (Mw/Mn) of from 1.0 to 1.6.

9. A pattern formation process comprising coating a positive resist composition to a substrate to prepare a resist file and irradiating the resist film with an actinic ray or radiation, followed by heating, developing, rinsing and drying, whereby a good resist pattern is formed, wherein the positive resist composition is a positive resist composition of claim 6.

10. The pattern formation process according to claim 9, wherein an electron beam, an X-ray or an EUV beam is employed as the actinic ray or radiation.

* * * * *